(12) United States Patent
Ikezawa et al.

(10) Patent No.: US 7,544,727 B2
(45) Date of Patent: Jun. 9, 2009

(54) ENCAPSULANT OF EPOXY RESIN, CURING AGENT, AND SECONDARY AMINOSILANE COUPLING AGENT OR PHOSPHATE

(75) Inventors: Ryoichi Ikezawa, Tsukuba (JP); Masanobu Fujii, Shimodate (JP); Shinsuke Hagiwara, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/260,463

(22) Filed: Oct. 28, 2005

(65) Prior Publication Data

US 2006/0074150 A1   Apr. 6, 2006

Related U.S. Application Data

(63) Continuation of application No. 10/381,052, filed as application No. PCT/JP01/08303 on Sep. 25, 2001, now abandoned.

(30) Foreign Application Priority Data

| Sep. 25, 2000 | (JP) | ............................. 2000-291067 |
| Dec. 28, 2000 | (JP) | ............................. 2000-402358 |
| Dec. 28, 2000 | (JP) | ............................. 2000-402359 |
| Dec. 28, 2000 | (JP) | ............................. 2000-402360 |
| Dec. 28, 2000 | (JP) | ............................. 2000-402361 |
| Dec. 28, 2000 | (JP) | ............................. 2000-402362 |
| Dec. 28, 2000 | (JP) | ............................. 2000-402363 |
| Mar. 22, 2001 | (JP) | ............................. 2001-082741 |

(51) Int. Cl.

| C08K 3/36 | (2006.01) |
| C08K 7/18 | (2006.01) |
| C08L 61/08 | (2006.01) |
| C08L 61/12 | (2006.01) |
| C08L 63/02 | (2006.01) |
| C08L 63/04 | (2006.01) |
| H01L 21/56 | (2006.01) |
| H01L 23/29 | (2006.01) |

(52) U.S. Cl. .................. 523/451; 523/457; 523/458; 523/466; 525/481; 525/486; 525/507; 257/793; 438/127

(58) Field of Classification Search ........................ None
See application file for complete search history.

(56) References Cited

U.S. PATENT DOCUMENTS

| 5,104,581 A | * | 4/1992 | Ito et al. ..................... 252/511 |
| 6,139,978 A |   | 10/2000 | Arai et al. |
| 6,231,997 B1 |   | 5/2001 | Arai et al. |

FOREIGN PATENT DOCUMENTS

| EP | 0384707 A2 |   | 8/1990 |
| EP | 384707 A2 | * | 8/1990 |
| EP | 0812883 A1 |   | 12/1997 |
| EP | 812883 A1 | * | 12/1997 |
| JP | 9-255852 A | * | 9/1997 |
| JP | 09255852 A |   | 9/1997 |
| JP | 10-182792 A | * | 7/1998 |
| JP | 10-195179 |   | 7/1998 |
| JP | 10182792 A |   | 7/1998 |
| JP | 10237160 A |   | 9/1998 |
| JP | 10237161 A |   | 9/1998 |
| JP | 10-279665 A | * | 10/1998 |
| JP | 10279665 A |   | 10/1998 |
| JP | 11-21427 A | * | 1/1999 |
| JP | 11021427 A |   | 1/1999 |
| JP | 11-189704 A | * | 7/1999 |
| JP | 11189639 |   | 7/1999 |
| JP | 11189704 A |   | 7/1999 |
| JP | 11-323090 |   | * 11/1999 |
| JP | 11323090 A |   | 11/1999 |
| JP | 2000-129093 |   | 5/2000 |

* cited by examiner

*Primary Examiner*—Robert Sellers
(74) *Attorney, Agent, or Firm*—Westerman, Hattori, Daniels & Adrian, LLP.

(57) ABSTRACT

An encapsulating epoxy resin molding material comprising (A) an epoxy resin, (B) a curing agent, and (C) a silane coupling agent having a secondary amino group or (D) a phosphate, and semiconductor devices encapsulated therein.

The encapsulating epoxy resin molding material for thin semiconductor devices according to this invention is excellent in fluidity, and the semiconductor device encapsulated therein, which is a semiconductor device having a semiconductor chip arranged on a thin, multi-pin, long wire, narrow-pad-pitch, or on a mounted substrate such as organic substrate or organic film, is free of molding defects such as wire sweep, voids etc. as shown in the Examples, and thus its industrial value is significant.

26 Claims, 4 Drawing Sheets

(a)

(b)

(c)

(a)

(b)

ENCAPSULANT OF EPOXY RESIN, CURING AGENT, AND SECONDARY AMINOSILANE COUPLING AGENT OR PHOSPHATE

CROSS-REFERENCE TO RELATED APPLICATION

This application is a Continuation application of application Ser. No. 10/381,052, filed Mar. 25, 2003, now abandoned, and wherein application Ser. No. 10/381,052 is a national stage application filed under 35 USC §371 of International Application No. PCT/JP01/08303, filed Sep. 25, 2001. The contents of application Ser. No. 10/381,052 are incorporated herein by reference in their entirety.

TECHNICAL FIELD

This invention relates to an epoxy resin molding material for encapsulation and a semiconductor device encapsulated therein. More specifically, this invention relates to an epoxy resin molding material for encapsulation excellent in fluidity and suitable for a thin semiconductor device having a semiconductor chip arranged on a thin, multi-pin, long wire, narrow pad pitch or mounted substrate to a thin semiconductor device encapsulated therein with less generation of molding defects such as wire sweep and voids and having a semiconductor chip arranged on a thin, multi-pin, long wire, narrow pad pitch or mounted substrate.

RELATED ART

High-density mounting on printed wiring boards for electronic parts is advancing in recent years. To cope therewith, packages of surface mounting type have come to be mainly used for semiconductor devices in place of conventional packages of pin insertion type. For increasing the density of mounting to decrease the height of mounting, IC and LSI of surface mounting type are in the form of a thin and small package where the ratio by volume of an element to the package is becoming high and the thickness of the package is becoming very thin. The area of the chip and pin count are being increased with multifunctionalization and higher capacity of the element and moreover as, the number of pad (electrode) is increasing, a reduction in pad pitch and a reduction in pad dimension, that is, narrowing of pad pitch is also advancing.

To cope with a further reduction in size and weight, the form of the package is being switched from QFP (Quad Flat Package) and SOP (Small Outline Package) and the like to CSP (Chip Size Package) and BGA (Ball Grid Array) coping more easily with a large pin count and capable of high-density mounting. New structures such as those of phase down type, stacked type, flip chip type, wafer level type etc. have been developed in recent years for these packages to effect higher speed and multifunctionalization. Among these, the stacked type structure is a structure wherein a plurality of chips are piled up in a package and connected by wire bonding so that a plurality of chips having different functions can be mounted in one package, thus achieving multifunctionalization.

In place of a conventional one-chip-one-cavity encapsulating method used in the step of encapsulation with resin in producing CSP and BGA, a mold array package type encapsulating method of encapsulating a plurality of chips with one cavity has been developed to effect an improvement in production efficiency and a reduction in costs.

On one hand, the encapsulating material is required to solve re-flow resistance as a problem upon mounting a semiconductor device on the surface of a printed circuit board and to sufficiently satisfy temperature cycling etc. required for reliability after mounting, and the encapsulating material is endowed with low moisture absorptivity and low expansibility by reduction in the resin viscosity and higher charging of fillers, in order to cope therewith.

DISCLOSURE OF INVENTION

However, the conventional encapsulating material often generates molding defects such as wire sweep and voids, thus making it difficult to produce thinner semiconductor devices, a larger area of chip, an increased pin count, narrower pad pitch, etc. To cope therewith, improvements in the encapsulating material have been attempted by further reduction in the resin viscosity and a change in the composition of fillers, but satisfactory results are still not obtained. A stricter fluidity characteristic is required for the encapsulating material for use in stacked type CSP for long wire or in semiconductor devices moldable by mold array package type molding with a high cavity volume.

Accordingly, an encapsulating epoxy resin molding material for semiconductor devices which is excellent in fluidity, as well as a semiconductor device encapsulated therein with less generation of molding defects such as wire sweep, voids etc. are required.

In one preferable embodiment, there is provided an epoxy resin molding material for encapsulation suitable for encapsulating a semiconductor device having a semiconductor chip arranged on a thin, multi-pin, long wire, narrow pad pitch or on a mounted substrate such as organic substrate or organic film.

In another preferable embodiment, there is provided a semiconductor device having a semiconductor chip arranged on a thin, multi-pin, long wire, narrow pad pitch or on a mounted substrate such as organic substrate or organic film, which has been encapsulated in the encapsulating epoxy resin molding material of the invention.

To solve the problem described above, an extensive study was made by the inventors, and as a result, it was found that the problem described above can be solved by a particular encapsulating epoxy resin molding material comprising a silane coupling agent having a secondary amino group, or a phosphate, as an essential component and by a semiconductor device encapsulated therein.

That is, this invention relates to:

(1) An encapsulating epoxy resin molding material comprising (A) an epoxy resin, (B) a curing agent, and (C) a silane coupling agent having a secondary amino group or (D) a phosphate, wherein a disk flow is 80 mm or more.

(2) An encapsulating epoxy resin molding material comprising (A) an epoxy resin, (B) a curing agent, and (C) a silane coupling agent having a secondary amino group or (D) a phosphate, wherein the encapsulating epoxy resin molding material is used for the semiconductor device having at least one of the following constitutions (a) to (f):

(a) at least one of an encapsulating material of an upper side of a semiconductor chip and an encapsulating material of a lower side of the semiconductor chip has a thickness 0.7 mm or less;

(b) the pin count is 80 or more;

(c) the length of the wire is 2 mm or more;

(d) the pad pitch on the semiconductor chip is 90 μm or less;

(e) the thickness of a package, in which the semiconductor chip is disposed on a mounting substrate, is 2 mm or less.

(f) the area of the semiconductor chip is 25 mm² or more.

(3) The encapsulating epoxy resin molding material described in the above-mentioned (2), wherein the disk flow is 80 mm or more.

(4) The encapsulating epoxy resin molding material described in any one of the above-mentioned (1) to (3), which further comprises (E) an inorganic filler.

(5) The encapsulating epoxy resin molding material described in any one of the above-mentioned (1) to (4), which further comprises (F) a curing accelerator.

(6) The encapsulating epoxy resin molding material described in any one of the above-mentioned (1) to (5), wherein the semiconductor device is a stacked type package.

(7) The encapsulating epoxy resin molding material described in any one of the above-mentioned (1) to (6), wherein the semiconductor device is a mold array package.

(8) The encapsulating epoxy resin molding material described in any one of the above-mentioned (1) to (7), wherein the melt viscosity of the epoxy resin (A) at 150° C. is 2 poises or less.

(9) The encapsulating epoxy resin molding material described in any one of the above-mentioned (1) to (8), wherein the epoxy resin (A) comprises at least one member of:

a biphenyl type epoxy resin represented by the general formula (I):

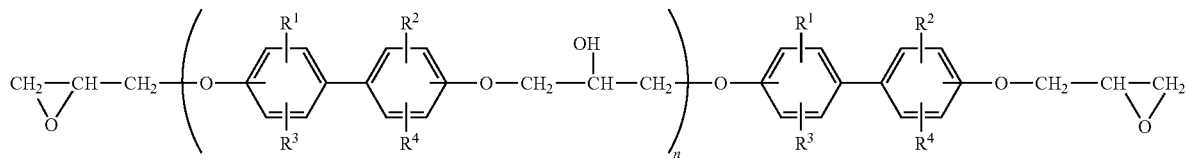

(I)

wherein $R^1$ to $R^4$ may be the same or different and are selected from a hydrogen atom and a $C_{1-10}$ substituted or unsubstituted monovalent hydrocarbon group, and n is an integer of 0 to 3, a bisphenol F type epoxy resin represented by the general formula (II):

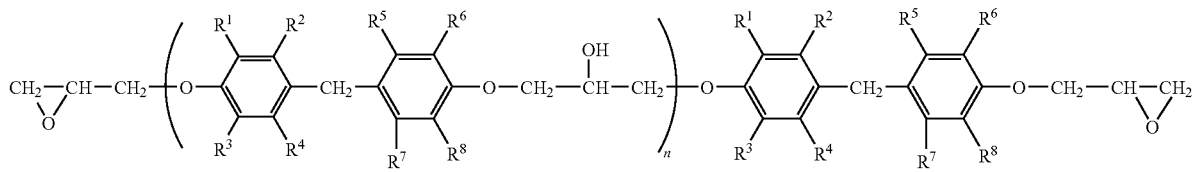

(II)

wherein $R^1$ to $R^8$ may be the same or different and are selected from a hydrogen atom, a $C_{1-10}$ alkyl group, a $C_{1-10}$ alkoxy group, a $C_{6-10}$ aryl group, and a $C_{6-10}$ aralkyl group, and n is an integer of 0 to 3, and a stilbene type epoxy resin represented by the general formula (III):

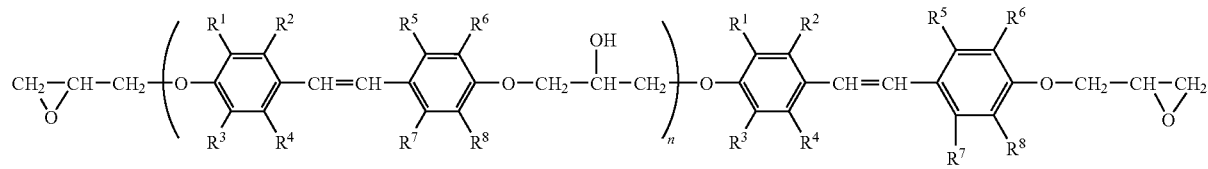

(III)

wherein $R^1$ to $R^8$ may be the same or different and are selected from a hydrogen atom, a $C_{1-10}$ alkyl group, a $C_{1-10}$ alkoxy group, a $C_{6-10}$ aryl group and a $C_{6-10}$ aralkyl group, and n is an integer of 0 to 3.

(10) The encapsulating epoxy resin molding material described in any one of the above-mentioned (1) to (9), wherein the melt viscosity of the curing agent (B) at 150° C. is 2 poises or less.

(11) The encapsulating epoxy resin molding material described in any one of the above-mentioned (1) to (10), wherein the curing resin (B) comprises:

a phenol-aralkyl resin represented by the general formula (IV):

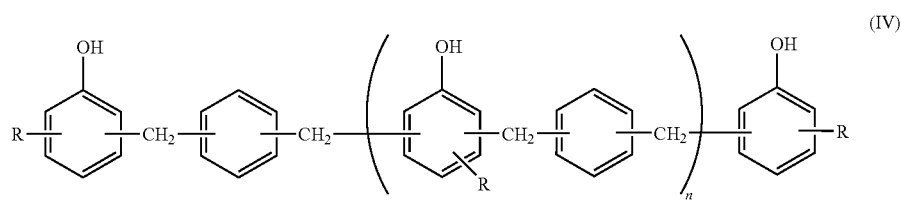

wherein R is selected from a hydrogen atom and a $C_{1-10}$ substituted or unsubstituted monovalent hydrocarbon group, and n is an integer of 0 to 10, and/or a biphenyl type phenol resin represented by the general formula (V):

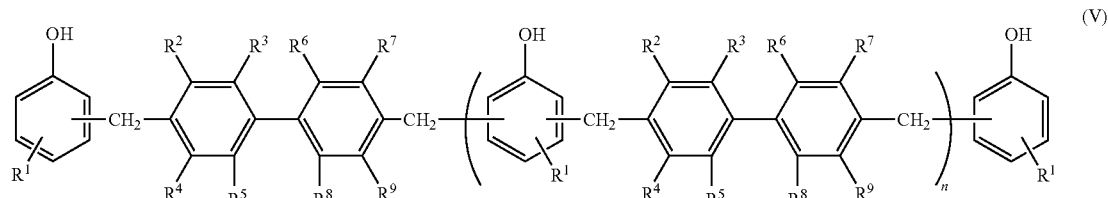

wherein $R_1$ to $R^9$ may be the same or different and are selected from a hydrogen atom, a $C_{1-10}$ alkyl group, a $C_{1-10}$ alkoxy group, a $C_{6-10}$ aryl group and a $C_{6-10}$ aralkyl group, and n is an integer of 0 to 10.

(12) The encapsulating epoxy resin molding material described in any one of the above-mentioned (1) to (11), wherein the silane coupling agent having a secondary amino group (C) comprises a compound represented by the general formula (VI):

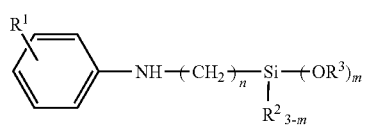

wherein $R^1$ is selected from a hydrogen atom, a $C_{1-6}$ alkyl group and a $C_{1-2}$ alkoxy group, $R^2$ is selected from a $C_{1-6}$ alkyl group and a phenyl group, $R^3$ represents methyl or ethyl group, n is an integer of 1 to 6, and m is an integer of 1 to 3.

(13) The encapsulating epoxy resin molding material described in any one of the above-mentioned (1) to (11), wherein the phosphate (D) comprises a compound represented by the general formula (X):

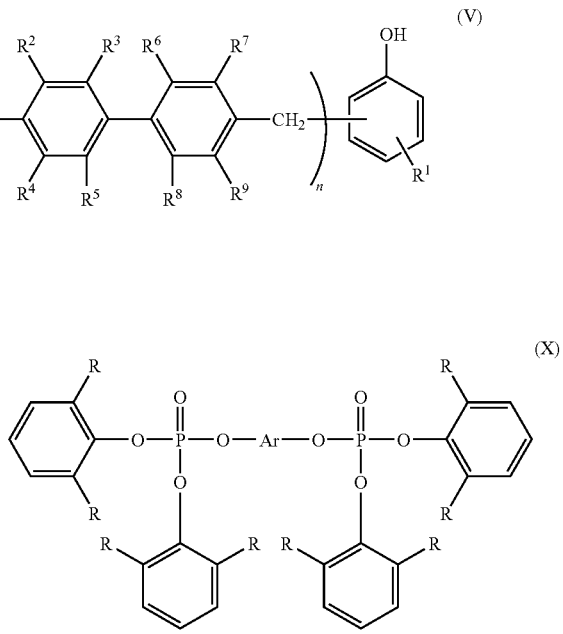

wherein eight R groups may be the same or different and represent a $C_{1-4}$ alkyl group, and Ar represents an aromatic group.

(14) A semiconductor device encapsulated in the encapsulating epoxy resin molding material described in any one of the above-mentioned (1) to (13).

(15) The semiconductor device described in the above-mentioned (14), having at least one of the following constitutions (a) to (f):

(a) at least one of an encapsulating material of an upper side of a semiconductor chip and an encapsulating material of a lower side of the semiconductor chip has a thickness 0.7 mm or less;

(b) the pin count is 80 or more, (c) the length of the wire is 2 mm or more, (d) the pad pitch on the semiconductor chip is 90 μm or less, (e) the thickness of a package, in which the semiconductor chip is disposed on a mounting substrate, is 2 mm or less;

(f) the area of the semiconductor chip is 25 mm² or more.

This application claims priority rights of Japanese Patent Applications previously filed by the same applicant, that is, Japanese Patent Application No. 2000-291067 (filing date: Sep. 25, 2000), Japanese Patent Application No. 2000-402358 (filing date: Dec. 28, 2000), Japanese Patent Application No. 2000-402359 (filing date: Dec. 28, 2000), Japanese Patent Application No. 2000-402360 (filing date: Dec. 28, 2000), Japanese Patent Application No. 2000-402361 (filing date: Dec. 28, 2000), Japanese Patent Application No. 2000-402362 (filing date: Dec. 28, 2000), Japanese Patent Application No. 2000-402363 (filing date: Dec. 28, 2000) and Japanese Patent Application No. 2001-82741 (filing date: Mar. 22, 2001), and these specifications are incorporated herein by reference.

DESCRIPTION OF SYMBOLS

Figure 1:
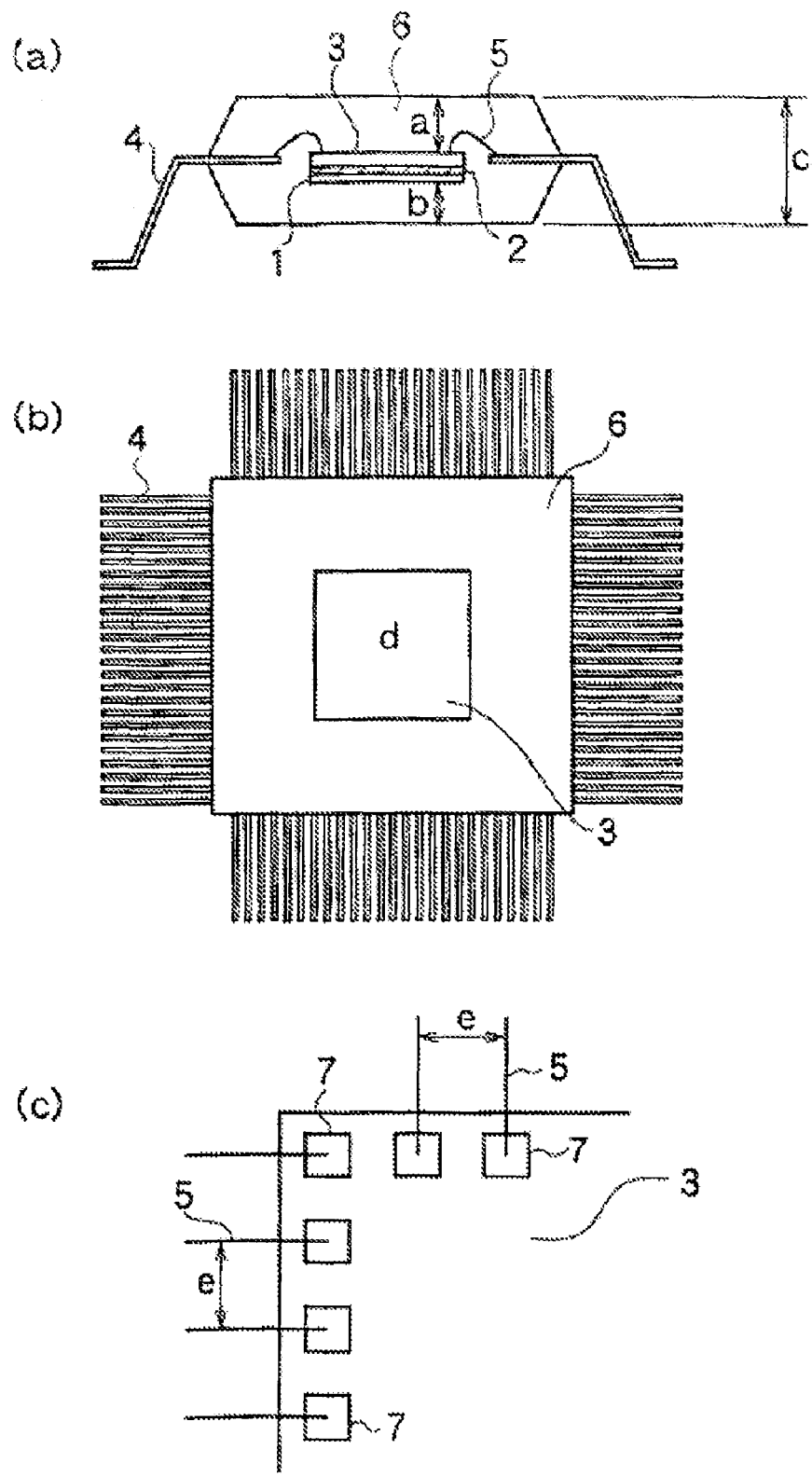
FIG. 1 shows (a) a sectional view, (b) an upper-surface (partially see-through) view and (c) an enlarged view of a region of bonding pads in a semiconductor device (QFP).

1: Island (tab).
2: Die attach
3: Semiconductor chip.
4: Lead pin.
5: Wire.
6: Epoxy resin molding material for encapsulation (encapsulating material).
7: Terminal (bonding pad).
8: Insulating base substrate.
9: Solder ball.
10: Terminal on the wiring board.

DESCRIPTION OF THE PREFERRED EMBODIMENT

According to this invention, there is provided an encapsulating epoxy resin molding material suitable for encapsulating a semiconductor device having a semiconductor chip arranged on a thin, multi-pin, long wire, narrow pad pitch, or on a mounted substrate such as organic substrate or organic film According to this invention, there is also provided a semiconductor device having a semiconductor chip arranged on a thin, multi-pin, long wire, narrow pad pitch, or on a mounted substrate such as organic substrate or organic film, which is encapsulated by the encapsulating epoxy resin molding material of the invention.

Hereinafter, the respective components used in the encapsulating epoxy resin molding material of the invention are described.

The epoxy resin (A) used in this invention is not particularly limited insofar as it is generally used in encapsulating epoxy resin molding materials, and examples thereof include phenol novolak type epoxy resin and o-cresol novolak type epoxy resin, for example a resin obtained by epoxidation of a novolak resin obtained in the presence of an acid catalyst by condensation of phenols such as phenol, cresol, xylenol, resorcin, catechol, bisphenol A, bisphenol F etc. and/or naphthols such as α-naphthol, β-naphthol, dihydroxynaphthalene etc., or by co-condensation thereof with compounds containing an aldehyde group, such as formaldehyde, acetaldehyde, propionaldehyde, benzaldehyde, salicylaldehyde etc.; glycidyl ether (e.g. diglycidyl ether) type epoxy resin made from bisphenol A, bisphenol F, bisphenol S, or alkyl substituted or unsubstituted biphenol; stilbene type epoxy resin; a sulfur atom-containing epoxy resin; a hydroquinone type epoxy resin; a glycidyl ester type epoxy resin obtained by reacting a polybasic acid such as phthalic acid, dimeric acid etc. with epichlorohydrin; a glycidyl amine type epoxy resin obtained by reacting a polyamine such as diaminodiphenyl methane, isocyanuric acid etc. with epichlorohydrin, an epoxidated product of a resin obtained by co-condensation of dicyclopentadiene with phenols and/or naphthols; an epoxy resin having a naphthalene ring; an epoxidated product of an aralkyl type phenol resin such as phenol-aralkyl resin, naphthol-aralkyl resin etc.; a trimethylol propane type epoxy resin; a terpene-modified epoxy resin; a linear aliphatic epoxy resin obtained by oxidizing olefin bonds with a peracid such as peracetic acid, and an aliphatic epoxy resin, and these may be used singly or in combination thereof.

Particularly from the viewpoint of flowability and re-flowing resistance, a biphenyl type epoxy resin represented by the following general formula (I) is preferable.

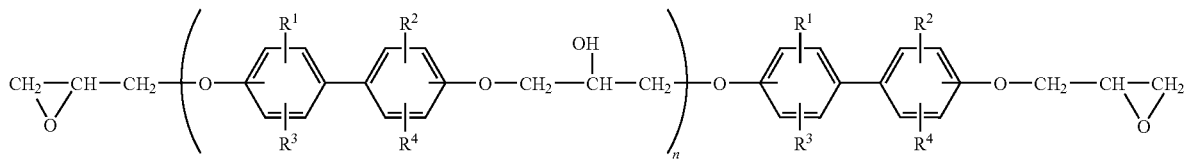

(I)

wherein $R^1$ to $R^4$ are selected from a hydrogen atom and $C_{1-10}$ substituted or unsubstituted monovalent hydrocarbon groups, and all the groups may be the same or different, and n is an integer of 0 to 3.

The biphenyl type epoxy resin represented by the general formula (I) includes, for example, an epoxy resin based on 4,4'-bis(2,3-epoxypropoxy)biphenyl or 4,4'-bis(2,3-epoxypropoxy)-3,3',5,5'-tetramethyl biphenyl and an epoxy resin obtained by reacting epichlorohydrin with 4,4'-biphenol or 4,4'-(3,3',5,5'-tetramethyl)biphenol. In particular, the epoxy resin based on 4,4'-bis(2,3-epoxypropoxy)-3,3',5,5'-tetramethyl biphenyl is preferable. When this biphenyl type epoxy resin is used, its compounding amount is preferably 30% by weight or more, more preferably 50% by weight or more, still more preferably 60% by weight or more, relative to the total amount of the epoxy resin, in order to exhibit its performance.

From the viewpoint of flowability and flame retardancy, bisphenol F type epoxy resin represented by the following general formula (II) is preferable.

wherein $R^1$ to $R^8$ are selected from a hydrogen atom, a $C_{1-10}$ alkyl group, $C_{1-10}$ alkoxy group, $C_{6-10}$ aryl group and $C_{6-10}$ aralkyl group, and all of the groups may be the same or different, and n is an integer of 0 to 3.

A commercial product based on the stilbene type epoxy resin represented by the general formula (III) wherein each of $R^1$, $R^3$, $R^6$ and $R^8$ is a methyl group, each of $R^2$, $R^4$, $R^5$ and $R^7$ is a hydrogen atom and n is 0, is available under the trade name ESLV-210 (a product of Sumitomo Chemical Co., Ltd.). When this stilbene type epoxy resin is used, its compounding amount is preferably 30% by weight or more, more preferably 50% by weight or more, relative to the total amount of the epoxy resin, in order to exhibit its performance.

From the viewpoint of re-flow resistance, a sulfur atom-containing epoxy resin represented by the following general formula (VII) is preferable.

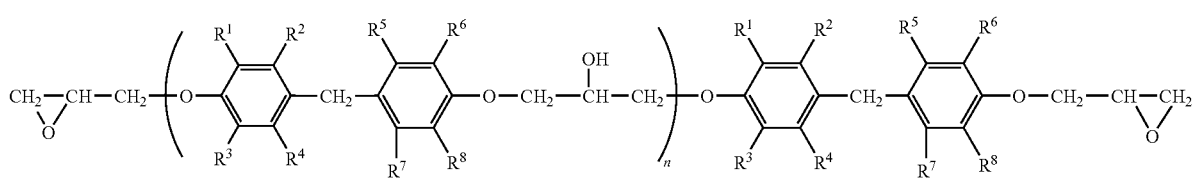

(II)

wherein $R^1$ to $R^8$ may be the same or different and are selected from a hydrogen atom, $C_{1-10}$ alkyl groups such as methyl group, ethyl group, propyl group, butyl group, isopropyl group, isobutyl group etc. $C_{1-10}$ alkoxy groups such as methoxy group, ethoxy group, propoxy group, butoxy group etc., $C_{6-10}$ aryl groups such as phenyl group, tolyl group, xylyl group etc., and $C_{6-10}$ aralkyl groups such as benzyl group, phenethyl group etc., among which a hydrogen atom and a methyl group are preferable, and n is an integer of 0 to 3.

A commercial product based on the bisphenol F type epoxy resin represented by the general formula (II) wherein each of $R^1$, $R^3$, $R^6$ and $R^8$ is a methyl group, each of $R^2$, $R^4$, $R^5$ and $R^7$ is a hydrogen atom and n is 0, is available under the trade name YSLV-80XY (a product of Nippon Steel Chemical Co., Ltd.). When this bisphenol F type epoxy resin is used, its compounding amount is preferably 30% by weight or more, more preferably 50% by weight or more, relative to the total amount of the epoxy resin, in order to exhibit its performance.

From the viewpoint of flowability and curing properties, stilbene type epoxy resin represented by the following general formula (III) is preferable.

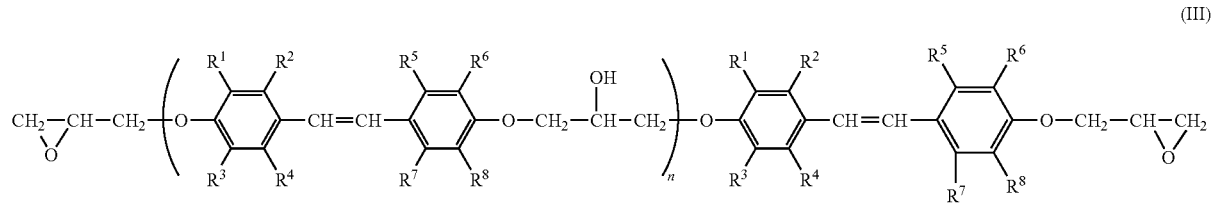

(III)

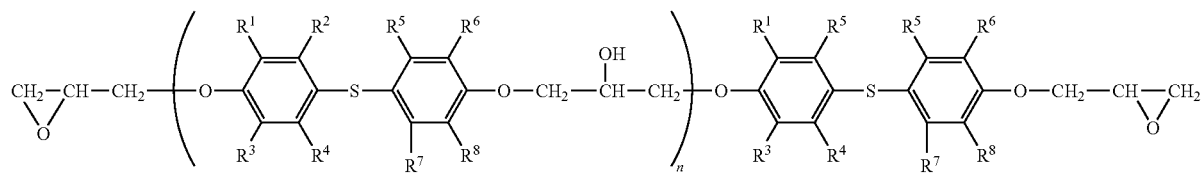

(VII)

wherein $R^1$ to $R^8$ may be the same or different, and are selected from a hydrogen atom, a $C_{1-10}$ alkyl group such as methyl group, ethyl group, propyl group, butyl group, isopropyl group, isobutyl group etc., a $C_{1-10}$ alkoxy group such as methoxy group, ethoxy group, propoxy group, butoxy group etc., a $C_{6-10}$ aryl group such as phenyl group, tolyl group, xylyl group etc., and a $C_{6-10}$ aralkyl group such as benzyl group, phenethyl group etc., among which a hydrogen atom, a methyl group and an isobutyl group are preferable, and n is an integer of 0 to 3.

A commercial product based on the sulfur atom-containing epoxy resin represented by the general formula (VII) wherein each of $R^1$ and $R^8$ is a methyl group, each of $R^3$ and $R^6$ is an isobutyl group, each of $R^2$, $R^4$, $R^5$ and $R^7$ is a hydrogen atom and n is 0, is available under the trade name YSLV-120TE (a product of Nippon Steel Chemical Co., Ltd.). When this sulfur atom-containing epoxy resin is used, its compounding amount is preferably 30% by weight or more, more preferably 50% by weight or more, relative to the total amount of the epoxy resin, in order to exhibit its performance.

To achieve the effect of the invention, it is more preferable to employ at least one member selected from the biphenyl type epoxy resin represented by the general formula (I) above, the bisphenol F type epoxy resin represented by the general formula (II) above and the stilbene type epoxy resin represented by the general formula (III) above, and two or all of these resins may be used in combination. When two or more resins are used in combination, their total compounding amount is preferably 60% by weight or more, more preferably 80% by weight or more, relative to the total amount of the epoxy resin.

From the viewpoint of flowability, the melt viscosity at 150° C. of the epoxy resin (A) used in this invention is preferably 2 P or less, more preferably 1 P or less, still more preferably 0.5 P or less. The melt viscosity refers to viscosity determined by an ICI cone plate viscometer.

The curing agent (B) used in this invention is not particularly limited insofar as it is generally used in encapsulating epoxy resin molding materials, and examples thereof include resins obtained in the presence of an acid catalyst by condensation of phenols such as phenol, cresol, resorcin, catechol, bisphenol A, bisphenol F, phenylphenol, aminophenol etc. and/or naphthols such as α-naphthol, β-naphthol, dihydroxy naphthalene etc., or by co-condensation thereof with a compound having an aldehyde group, such as formaldehyde, and aralkyl type phenol resins such as phenol-aralkyl resin, naphthol-aralkyl resin etc. synthesized from phenols and/or naphthols and dimethoxyparaxylene or bis(methoxymethyl)biphenyl, and these may be used singly or in combination thereof.

From the viewpoint of re-flow resistance, a phenol-aralkyl resin represented by the following general formula (IV) is preferable, and a phenol-aralkyl resin wherein R is a hydrogen atom and n is 0 to 8 on average is more preferable, and examples of such resin include p-xylylene type xyloc[phonetic transcription], m-xylylene type xyloc etc. When this phenol-aralkyl resin is used, its compounding amount is preferably 30% by weight or more, more preferably 50% by weight or more, still more preferably 60% by weight or more, relative to the total amount of the curing agent, in order to exhibit its performance.

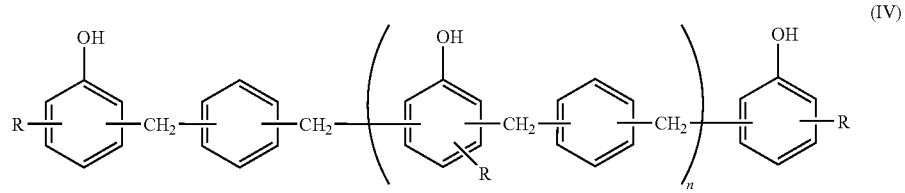

(IV)

wherein R is selected from a hydrogen atom and a $C_{1-10}$ substituted or unsubstituted monovalent hydrocarbon group, and n is an integer of 0 to 10.

From the viewpoint of flame retardancy, a biphenyl type phenol resin represented by the general formula (V) is preferable.

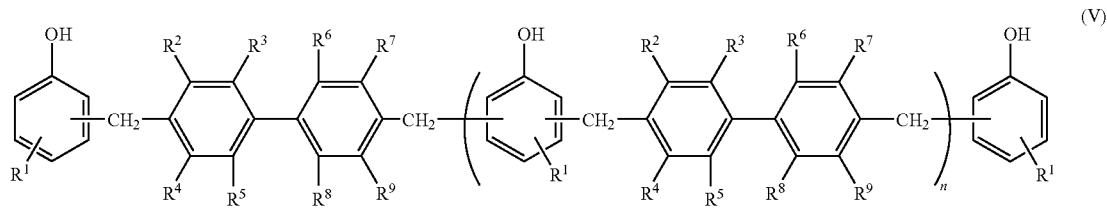

wherein $R^1$ to $R^9$ may be the same or different, and are selected from a hydrogen atom, a $C_{1-10}$ alkyl group such as methyl group, ethyl group, propyl group, butyl group, isopropyl group, isobutyl group etc., a $C_{1-10}$ alkoxy group such as methoxy group, ethoxy group, propoxy group, butoxy group etc., a $C_{6-10}$ aryl group such as phenyl group, tolyl group, xylyl group etc., and a $C_{6-10}$ aralkyl group such as benzyl group, phenethyl group etc., among which a hydrogen atom and a methyl group are preferable, and n is an integer of 0 to 10.

The biphenyl type phenol resin represented by the general formula (V) includes, for example, a compound wherein each of $R^1$ to $R^9$ is a hydrogen atom, and particularly a condensate mixture containing at least 50% by weight of condensates wherein n is 1 or more is preferable from the viewpoint of melt viscosity. Such compound is commercially available under the trade name MEH-7851 (a product of Meiwa Plastic Industries Ltd.). When this biphenyl type phenol resin is used, its compounding amount is preferably 30% by weight or more, more preferably 50% by weight or more, relative to the total amount of the curing agent, in order to exhibit its performance.

The phenol-aralkyl resin represented by the general formula (IV) may be used in combination with the biphenyl type phenol resin represented by the general formula (V). When the two are used in combination, their total compounding amount is preferably 60% by weight or more, more preferably 80% by weight or more, relative to the total amount of the curing agent.

From the viewpoint of flowability, the melt viscosity at 150° C. of the curing agent (B) used in this invention is preferably 2 P or less, more preferably 1 P or less. The melt viscosity refers to ICI viscosity.

The equivalent ratio of the epoxy resin (A) to the curing agent (B), that is, the ratio of the number of epoxy groups in the epoxy resin to the number of hydroxyl groups in the curing agent is not particularly limited, but the ratio is set preferably in the range of 0.5 to 2, more preferably in the range of 0.6 to 1.3, in order to reduce the amount of unreacted materials. For obtaining the encapsulating epoxy resin molding material excellent in moldability and re-flow resistance, the ratio is set more preferably in the range of 0.8 to 1.2.

The silane coupling agent having a secondary amino group (C) used in this invention is not particularly limited insofar as it is a silane compound having a secondary amino group in the molecule, and examples thereof include γ-anilinopropyltrimethoxy silane, γ-anilinopropyltriethoxy silane, γ-anilinopropylmethyldimethoxy silane, γ-anilinopropylmethyldiethoxy silane, γ-anilinopropylethyldiethoxy silane, γ-anilinopropylethyldimethoxy silane, γ-anilinomethyltrimethoxy silane, γ-anilinomethyltriethoxy silane, γ-anilinomethylmethyldimethoxy silane, γ-anilinomethylmethyldiethoxy silane, γ-anilinomethylethyldiethoxy silane, γ-anilinomethylethyldimethoxy silane, N-(p-methoxyphenyl)-γ-aminopropyltrimethoxy silane, N-(p-methoxyphenyl)-γ-aminopropyltriethoxy silane, N-(p-methoxyphenyl)-γ-aminopropylmethyldimethoxy silane, N-(p-methoxyphenyl)-γ-aminopropylmethyldiethoxy silane, N-(p-methoxyphenyl)-γ-aminopropylethyldiethoxy silane, N-(p-methoxyphenyl)-γ-aminopropylethyldimethoxy silane, γ-(N-methyl)aminopropyltrimethoxy silane, γ-(N-ethyl)aminopropyltrimethoxy silane, γ-(N-butyl)aminopropyltrimethoxy silane, γ-(N-benzyl)aminopropyltrimethoxy silane, γ-(N-methyl)aminopropyltriethoxy silane, γ-(N-ethyl)aminopropyltriethoxy silane, γ-(N-butyl)aminopropyltriethoxy silane, γ-(N-benzyl)aminopropyltriethoxy silane, γ-(N-methyl)aminopropylmethyldimethoxy silane, γ-(N-ethyl)aminopropylmethyldimethoxy silane, γ-(N-butyl)aminopropylmethyldimethoxy silane, γ-(N-benzyl) aminopropylmethyldimethoxy silane, N-β-(aminoethyl)-γ-aminopropyltrimethoxy silane, γ-(β-aminoethyl) aminopropyltrimethoxy silane, N-β-(N-vinylbenzylaminoethyl)-γ-aminopropyl trimethoxy silane, etc. Particularly from the viewpoint of achieving flowability and particularly excellent disk flow, an amino silane coupling agent represented by the general formula (VI) is preferable.

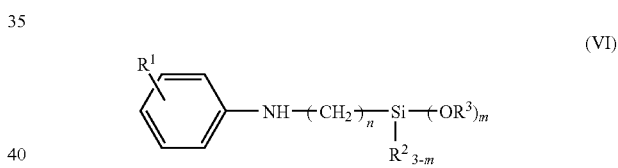

wherein $R^1$ is selected from a hydrogen atom, a $C_{1-6}$ alkyl group and a $C_{1-2}$ alkoxy group, $R^2$ is selected from a $C_{1-6}$ alkyl group and a phenyl group, $R^3$ represents a methyl or ethyl group, n is an integer of 1 to 6, and m is an integer of 1 to 3.

The aminosilane coupling agent represented by the general formula (VI) includes, for example, γ-anilinopropyltrimethoxy silane, γ-anilinopropyltriethoxy silane, γ-anilinopropylmethyldimethoxy silane, γ-anilinopropylmethyldiethoxy silane, γ-anilinopropylethyldiethoxy silane, γ-anilinopropylethyldimethoxy silane, γ-anilinomethyltrimethoxy silane, γ-anilinomethyltriethoxy silane, γ-anilinomethylmethyldimethoxy silane, γ-anilinomethylmethyldiethoxy silane, γ-anilinomethylethyldiethoxy silane, γ-anilinomethylethyldimethoxy silane, N-(p-methoxyphenyl)-γ-aminopropyltrimethoxy silane, N-(p-methoxyphenyl)-γ-aminopropyltriethoxy silane, N-(p-methoxyphenyl)-γ-aminopropylmethyldimethoxy silane, N-(p-methoxyphenyl)-γ-aminopropylmethyldiethoxy silane, N-(p-methoxyphenyl)-γ-aminopropylethyldiethoxy silane, N-(p-methoxyphenyl)-γ-aminopropylethyldimethoxy silane etc. The aminosilane coupling agent is particularly preferably γ-anilinopropyltrimethoxy silane.

When the silane coupling agent having a secondary amino group (C) is compounded into the encapsulating epoxy resin molding material, adhesion of the essential components to arbitrary components such as fillers is improved, resulting in bringing about a working effect by which the functions of the essential components and arbitrary components are preferably exhibited. From the viewpoint of preferable exhibition of the working effect of the arbitrary components particularly the inorganic filler (E) described later, the inorganic filler (E) is added preferably when the silane coupling agent having a secondary amino group (C) is used.

The compounding amount of the silane coupling agent having a secondary amino group (C) is preferably 0.037 to 4.75% by weight, more preferably 0.088 to 2.3% by weight, relative to the encapsulating epoxy resin molding material. When its amount is less than 0.037% by weight, the disk flow is decreased, and molding defects such as wire sweep, voids etc. tend to occur easily, and adhesion to a frame tends to be lowered. When the amount is higher than 4.75% by weight, the moldability of a package tends to be lowered.

When the inorganic filler (E) described later is added, the compounding amount of the silane coupling agent having a secondary amino group (C) is 0.05 to 5% by weight, more preferably 0.1 to 2.5% by weight, relative to the inorganic filler (E). The reason for this definition of the compounding amount is the same as described above.

The phosphate (D) used in this invention is not particularly limited as long as it is an ester of phosphoric acid with an alcohol compound or a phenol compound, and examples thereof include trimethyl phosphate, triethyl phosphate, triphenyl phosphate, tricresyl phosphate, trixylenyl phosphate, cresyldiphenyl phosphate, xylenyldiphenyl phosphate, tris(2,6-dimethylphenyl)phosphate, and an aromatic condensed phosphate. From the viewpoint of hydrolysis resistance, an aromatic condensed phosphate represented by the following general formula (X) is preferable.

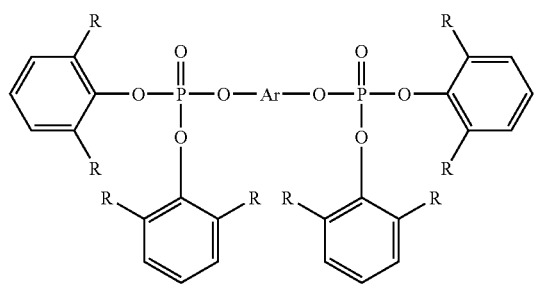
(X)

Examples of the phosphate (D) of the formula (X) above include phosphates shown by the following structural formulae (XI) to (XV):

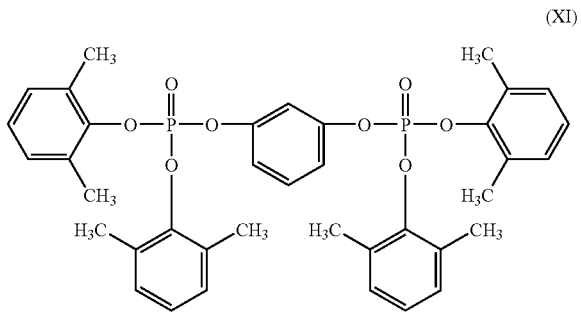
(XI)

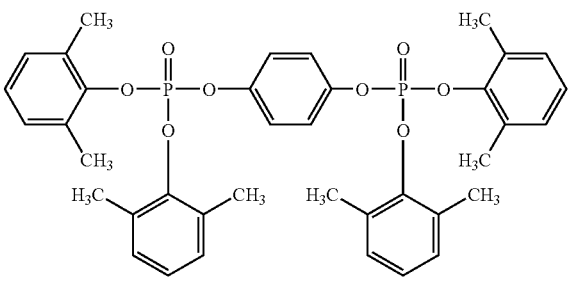
(XII)

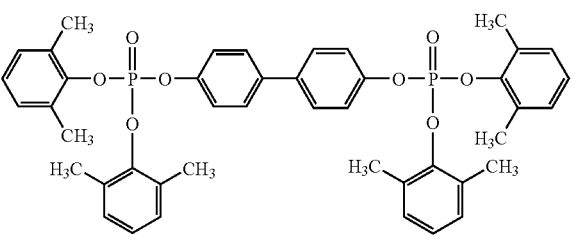
(XIII)

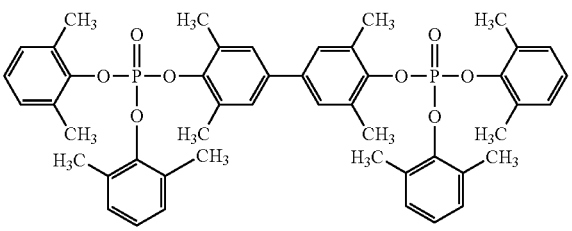
(XIV)

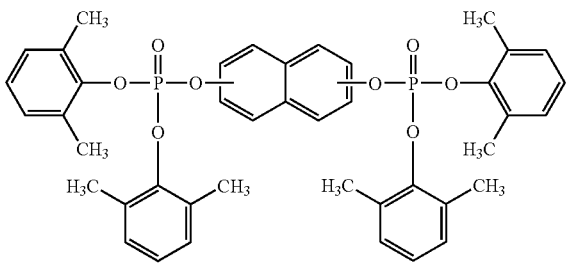
(XV)

The amount of the phosphate (D) added is preferably in the range of 0.2 to 3.0% by weight in terms of phosphorus atom, relative to the whole compounding components excluding the filler. When its amount is less than 0.2% by weight, the disk flow is decreased, and molding defects such as wire sweep, voids etc. occur easily. Further, the phosphate (D) has a flame-retardant effect so that when used also as a flame-retardant, the flame retardant effect tends to be lowered. When the amount is higher than 3.0% by weight, moldability and humidity resistance may be lowered, and the phosphate may bleed out at the time of molding to deteriorate the outward appearance.

In this invention, the inorganic filler (E) is preferably compounded in addition to the components (A), (B) and (C) or (D). The inorganic filler (E) used in this invention is compounded into the encapsulating epoxy resin molding material thereby improving moisture absorption, lowering coefficient of linear expansion, improving thermal conductivity and improving strength. Examples thereof include powders, spherical beads, glass fibers etc. prepared from fused silica, crystalline silica, alumina, zircon, calcium silicate, calcium carbonate, potassium titanate, silicon carbide, silicon nitride, aluminum nitride, boron nitride, beryllia, zirconia, zircon, forsterite, steatite, spinel, mullite, titania etc. Further, inorganic fillers having a flame retardant effect include aluminum hydroxide, magnesium hydroxide, zinc borate, zinc molybdate etc. These inorganic fillers maybe used singly or in combination thereof. In particular, fused silica is preferable from the viewpoint of a reduction in coefficient of linear expansion and alumina is preferable from the viewpoint of higher thermal conductivity, while the shape of the inorganic fillers is preferably spherical from the viewpoint of flowability during molding and abrasion of molds.

When the inorganic filler (E) is used, its compounding amount is preferably 75% by weight or more relative to the encapsulating epoxy resin molding material from the viewpoint of re-flow resistance. From the viewpoint of improvements in re-flow resistance, flowability, moldability and strength, the amount is more preferably 80 to 95% by weight, still more preferably 88 to 92% by weight.

When the inorganic filler (E) is used, a coupling agent is preferably compounded into the encapsulating epoxy resin molding material of the invention in order to improve adhesion of the resin component to the filler. The coupling agent is preferably the silane coupling agent having a secondary amino group (C), but if necessary, other coupling agents can also be used in combination in such a range as to achieve the effect of the invention. The other coupling agents which can be used in combination with the silane coupling agent having a secondary amino group (C) are not particularly limited as long as they are generally used in encapsulating epoxy resin molding materials, and examples thereof include silane compounds having a primary amino group and/or tertiary amino group, various kinds of silane type compounds such as epoxysilane, mercaptosilane, alkyl silane, ureidosilane, vinylsilane etc., titanium type compounds, aluminum chelates, aluminum/zirconium type compounds etc. Specific examples of these compounds include silane type coupling agents such as vinyltrichlorosilane, vinyltriethoxy silane, vinyltris(β-methoxyethoxy)silane, γ-methacryloxy propyltrimethoxy silane, β-(3,4-epoxycyclohexyl)ethyltrimethoxy silane, γ-glycidoxypropyltrimethoxy silane, γ-glycidoxypropylmethyldimethoxy silane, vinyltriacetoxy silane, γ-mercaptopropyltrimethoxy silane, γ-aminopropyltrimethoxy silane, γ-aminopropylmethyldimethoxy silane, γ-aminopropyltriethoxy silane, γ-aminopropylmethyldiethoxy silane, γ-(N,N-dimethyl)aminopropyltrimethoxy silane, γ-(N,N-diethyl)aminopropyltrimethoxy silane, γ-(N,N-dibutyl)aminopropyltrimethoxy silane, γ-(N-methyl)anilinopropyltrimethoxy silane, γ-(N-ethyl)anilinopropyltrimethoxy silane, γ-(N,N-dimethyl)aminopropyltriethoxy silane, γ-(N,N-diethyl) aminopropyltriethoxy silane, γ-(N,N-dibutyl) aminopropyltriethoxy silane, γ-(N-methyl)anilinopropyltriethoxy silane, γ-(N-ethyl)anilinopropyltriethoxy silane, γ-(N,N-dimethyl)aminopropylmethyldimethoxy silane, γ-(N,N-diethyl)aminopropylmethyldimethoxy silane, γ-(N,N-dibutyl) aminopropylmethyldimethoxy silane, γ-(N-methyl) anilinopropylmethyldimethoxy silane, γ-(N-ethyl) anilinopropylmethyldimethoxy silane, N-(trimethoxysilylpropyl)ethylene diamine, N-(dimethoxymethylsilylisopropyl)ethylene diamine, methyltrimethoxy silane, dimethyldimethoxy silane, methyltriethoxy silane, γ-chloropropyltrimethoxy silane, hexamethyl disilane, vinyltrimethoxy silane and γ-mercaptopropylmethyl dimethoxy silane;

and titanate type coupling agents such as isopropyltriisostearoyl titanate, isopropyl tris(dioctylpyrophosphate)titanate, isopropyl tri(N-aminoethyl-aminoethyl)titanate, tetraoctyl bis(ditridecylphosphite)titanate, tetra(2,2-diallyloxymethyl-1-butyl)bis(ditridecyl)phosphite titanate, bis(dioctylpyrophosphate)oxyacetate titanate, bis(dioctylpyrophosphate) ethylene titanate, isopropyltrioctanoyl titanate, isopropyldimethacryl isostearoyl titanate, isopropyltridecylbenzenesulfonyl titanate, isopropylisostearoyldiacryl titanate, isopropyl tri(dioctylphosphate)titanate, isopropyltricumylphenyl titanate and tetraisopropyl bis (dioctylphosphite)titanate, and these may be used singly or in combination thereof.

When these other coupling agents are used, the amount of the silane coupling agent having a secondary amino group (C) is preferably 30% by weight or more, more preferably 50% by weight or more, relative to the total amount of the coupling agent, in order to exhibit its performance.

The total amount of the coupling agent containing the silane coupling agent having a secondary amino group (C) is preferably 0.037 to 4.75% by weight, more preferably 0.088 to 2.3% by weight, relative to the encapsulating epoxy resin molding material. When the amount is less than 0.037% by weight, the adhesion to a frame tends to be lowered, while when the amount is higher than 4.75% by weight, the moldability of a package tends to be lowered.

When the inorganic filler (E) is added, the amount of the coupling agent compounded is 0.05 to 5% by weight, more preferably 0.1 to 2.5% by weight, relative to the inorganic filler (E). The reason for this definition of the compounding amount is the same as described above.

From the viewpoint of curing properties, the curing promoter (F) is further incorporated in this invention. The curing promoter (F) used in this invention is not particularly limited insofar as it is generally used in encapsulating epoxy resin molding materials, and examples thereof include cycloamidine compounds such as 1,8-diaza-bicyclo(5,4,0)undecene-7, 1,5-diaza-bicyclo(4,3,0)nonene, 5,6-dibutylamino-1,8-diaza-bicyclo(5,4,0)undecene-7 etc., compounds having intramolecular polarization, comprising the above compounds to which maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone etc., or a compound having a π bonding such as diazophenyl methane, phenol resin etc. has been added, tertiary amines such as benzyldimethylamine, triethanolamine, dimethylaminoethanol, tris(dimethylaminomethyl)phenol etc. and derivatives thereof, imidazoles such as 2-methyl imidazole, 2-phenyl imidazole, 2-phenyl-4-methyl imidazole etc. and derivatives thereof, organic phosphines such as tributyl phosphine, methyl diphenyl phosphine, triphenyl phosphine, tris(4-methylphenyl)phosphine, diphenyl phosphine, phenyl phosphine etc., phosphorus compounds having intermolecular polarization, comprising maleic anhydride, the quinone compound, or the compound having a π bonding such as diazophenyl methane, phenol resin etc. added to the organic phosphine, and tetraphenyl borates such as tetraphenyl phosphonium tetraphenyl borate, triphenyl phosphine tetraphenyl borate, 2-ethyl-4-methylimidazole tetraphenyl borate, N-methylmorpholine tetraphenyl borate etc. and derivatives thereof, and these may used singly or in combination thereof. Particularly from the viewpoint of moldability and re-flow resistance, an adduct of organic phosphine and a quinone compound is preferable.

Although the amount of the curing promoter compounded is not particularly limited insofar as the curing promoting effect can be achieved, the amount is preferably 0.005 to 2% by weight, more preferably 0.01 to 0.5% by weight, relative to the encapsulating epoxy resin molding material. When the amount is less than 0.005% by weight, the resulting material is inferior in curing in a short time, while when the mount is higher than 2% by weight, the curing rate is too high thus making preparation of good molded articles difficult.

From the viewpoint of preventing occurrence of molding defects such as wire sweep, voids etc., the disk flow of the encapsulating epoxy resin molding material of the invention is preferably 80 mm or more. The disk flow is an indicator of flowability under a loading of 78 N, and refers to the average of the measured major axis and minor axis of a molded product produced by molding 5 g encapsulating epoxy resin molding material under the conditions of a mold temperature of 180° C., a loading of 78 N, and a curing time of 90 seconds.

By using the encapsulating epoxy resin molding material having a disk flow of 80 mm or more, it is possible to reduce molding defects such as wire sweep and voids even on a semiconductor device having a semiconductor chip arranged on a thin, multi-pin, long wire, or narrow pad pitch or on a mounted substrate.

The encapsulating epoxy resin molding material of the invention includes an encapsulating epoxy resin molding material comprising, as essential components, the epoxy resin (A), the curing agent (B) and the silane coupling agent having a secondary amino group (C) or the phosphate (D), and if necessary (E) inorganic filler and the curing promoter (F).

The encapsulating epoxy resin molding material of the invention is used preferably in a semiconductor device having at least one of the following constitutions (a) to (f):

(a) at least one of an encapsulating material of an upper side of a semiconductor chip and an encapsulating material of a lower side of the semiconductor chip has a thickness 0.7 mm or less;

(b) the pin count is 80 or more;

(c) the length of the wire is 2 mm or more;

(d) the pad pitch on the semiconductor chip is 90 μm or less;

(e) the thickness of a package, in which the semiconductor chip is disposed on a mounting substrate, is 2 mm or less;

(f) the area of the semiconductor chip is 25 mm$^2$ or more.

The encapsulating epoxy resin molding material of the invention can be used in the semiconductors device having at least one of the above constitutions (a) to (f), particularly preferably in semiconductor devices having the following constitution.

From the viewpoint of a reduction in voids, the encapsulating epoxy resin molding material of the invention is used preferably in a semiconductor device having the constitution (a) or (e), more preferably in a semiconductor device having the constitution (a), still more preferably in a semiconductor device having the constitution (a) and at least one of the other constitutions.

From the viewpoint of a reduction in wire sweep, the encapsulating epoxy resin molding material of the invention is used preferably in a semiconductor device having the constitution (b), (c) or (d), more preferably in a semiconductor device having the constitution (b), still more preferably in a semiconductor device having the constitutions (b) and (c) or the constitutions (b) and (d), particularly preferably in a semiconductor device having the constitutions (b), (c) and (d).

From the viewpoint of a reduction in voids and a reduction in wire sweep, the encapsulating epoxy resin molding material of the invention is used preferably in a semiconductor device having the constitutions (a) and (b), the constitutions (a) and (c), the constitutions (a) and (d), the constitutions (a) and (f), or the constitutions (c) and (e), more preferably in a semiconductor device having the constitutions (a), (b) and (d) or the constitutions (c), (e) and (f), still more preferably in a semiconductor device having the constitutions (a), (b), (d) and (f), or the constitutions (a), (b), (c) and (d).

In a first preferable embodiment of the encapsulating epoxy resin molding material of the invention, the epoxy resin (A), the curing agent (B), the silane coupling agent having a secondary amino group (C), and arbitrary components, that is, the inorganic filler (E) and other additives, are combined and their amounts are regulated, whereby the encapsulating epoxy resin molding material having a disk flow of 80 mm or more can be obtained. Selection of the epoxy resin (A), the curing agent (B) and the silane coupling agent having a secondary amino group (C), and the compounding amount of the inorganic filler (E) if used, are particularly important.

In a second preferable embodiment of the encapsulating epoxy resin molding material of the invention, the epoxy resin (A), the curing agent (B), the silane coupling agent having a secondary amino group (C), the inorganic filler (E) and the curing promoter (F) are combined and their amounts are regulated, whereby the encapsulating epoxy resin molding material having a disk flow of 80 mm or more can be obtained. Selection of the epoxy resin (A), the curing agent (B), the silane coupling agent having a secondary amino group (C) and the curing promoter (F), and the compounding amount of the inorganic filler (E), are particularly important.

In a third preferable embodiment of the encapsulating epoxy resin molding material of the invention, the epoxy resin (A), the curing agent (B), the phosphate (D), the inorganic filler (E), the curing promoter (F), and components used as other additives are combined and their amounts are regulated, whereby the encapsulating epoxy resin molding material having a disk flow of 80 mm or more can be obtained. Selection of the epoxy resin (A), the curing agent (B), the phosphate (D) and the curing promoter (F), and the compounding amount of the inorganic filler (E), are particularly important, and the compounding amounts of these components are as described above.

The encapsulating epoxy resin molding material of the invention may, if necessary, incorporate known flame-retardants such as brominated epoxy resin, antimony trioxide, phosphorus compounds such as phosphate, red phosphorus etc., nitrogen-containing compounds such as melamine, melamine cyanurate, melamine-modified resin, guanamine-modified phenol resin etc., phosphorus/nitrogen-containing compounds such as cyclophosphagen, and metal compounds such as zinc oxide, iron oxide, molybdenum oxide, ferrocene etc.

From the viewpoint of improvements in humidity resistance and high-temperature resistance of semiconductors such as IC, the encapsulating epoxy resin molding material of the invention can also incorporate anion exchangers. The anion exchangers are not particularly limited, and may be those known in the art, and examples thereof include hydrotalcite and hydrous oxides of an element selected from magnesium, aluminum, titanium, zirconium and bismuth, and these are used singly or in combination thereof. In particular, the hydrotalcite represented by the following formula (VIII) is preferable.

$$Mg_{1-X}Al_X(OH)_2(CO_3)_{X/2} \cdot mH_2O \tag{VIII}$$

(0<X≦0.5; m is an integer)

Further, the encapsulating epoxy resin molding material of the invention can, if necessary, incorporate other additives, for example releasing agents such as higher fatty acids, higher fatty acid metal salts, ester type wax, polyolefin type wax, polyethylene, oxidized polyethylene etc., coloring agents such as carbon black, and stress-releasing agents such as silicone oil and silicone rubber powder.

The encapsulating epoxy resin molding material of the invention can be prepared by any means which can disperse and mix the various starting materials, and a method of mixing predetermined amounts of the starting materials sufficiently in a mixer, then mixing or melt-kneading the mixture in a mixing roll, an extruder, a stone mill, a planetary mixer etc., cooling the mixture, defoaming it if necessary, and grinding it, can be mentioned as a general means. If necessary, the product may be formed into tablets having dimensions and weight meeting molding conditions if necessary.

The most general method of encapsulating a semiconductor device with the encapsulating epoxy resin molding material of the invention is low-pressure transfer molding, but injection molding, compression molding etc. can also be mentioned. A dispense system, injection system, printing system etc. may also be used.

The semiconductor device of this invention includes a general semiconductor device comprising an active element such as a semiconductor chip, transistor, diode, thyristor etc. or a passive element such as capacitor, resistance element, coil etc. installed on a supporting member such as a lead frame, a wired tape carrier, a circuit board, glass, a silicon wafer etc. or on a mounted substrate, wherein an encapsulating epoxy resin molding material comprising, as essential components, the epoxy resin (A), the curing agent (B) and the silane coupling agent having a secondary amino group (C) or the phosphate (D), and if necessary (E) inorganic filler and the curing promoter (F) is used as an encapsulating material.

The mounted substrate is not particularly limited, and include e.g. an interposer substrate such as organic substrate, organic film, ceramic substrate, glass substrate etc., a glass substrate for liquid crystal, a substrate for MCM (multi chip module), a substrate for hybrid IC, etc.

Preferably, the semiconductor device of the invention further has at least one of the following constitutions (a) to (f):

(a) at least one of an encapsulating material of an upper side of a semiconductor chip and an encapsulating material of a lower side of the semiconductor chip has a thickness 0.7 mm or less;

(b) the pin count is 80 or more;

(c) the length of the wire is 2 mm or more;

(d) the pad pitch on the semiconductor chip is 90 μm or less;

(e) the thickness of a package, in which the semiconductor chip is disposed on a mounting substrate, is 2 mm or less;

(f) the area of the semiconductor chip is 25 mm$^2$ or more.

Out of the semiconductor devices having at least one of the constitutions (a) to (f) described above, those semiconductor devices having the following constitution are particularly preferable from the viewpoint of a higher effect of the invention.

From the viewpoint of a higher effect on reduction in voids, the semiconductor device is preferably a semiconductor device having the constitution (a) or (e), more preferably a semiconductor device having the constitution (a), still more preferably a semiconductor device having the constitution (a) and at least one of the other constitutions.

From the viewpoint of a higher effect on reduction in wire sweep, the semiconductor device is preferably a semiconductor device having the constitution (b), (c) or (d), more preferably a semiconductor device having the constitution (b), still more preferably a semiconductor device having the constitutions (b) and (c) or the constitutions (b) and (d), particularly preferably a semiconductor device having the constitutions (b), (c) and (d).

From the viewpoint of a higher effect on reduction in voids and wire sweep, the semiconductor device is preferably a semiconductor device having the constitutions (a) and (b), the constitutions (a) and (c), the constitutions (a) and (d), the constitutions (a) and (f), or the constitutions (c) and (e), more preferably a semiconductor device having the constitutions (a), (b) and (d) or the constitutions (c), (e) and (f), still more preferably a semiconductor device having the constitutions (a), (b), (d) and (f), or the constitutions (a), (b), (c) and (d).

Such semiconductor devices include, for example, resin encapsulating type IC such as DIP (dual inline package), PLCC (plastic leaded chip carrier), QFP (quad flat package), SOP (small outline package), SOJ (small outline J-lead package), TSOP (thin small outline package), TQFP (thin quad flat package) etc., produced by fixing an element such as semiconductor chip on a lead frame (island tab), connecting a terminal (e.g. a bonding pad) of the element to the lead by wire bonding or bumping, and then encapsulating the semiconductor chip by transfer molding with the encapsulating epoxy resin molding material of the invention; TCP (tape carrier package) wherein a semiconductor chip lead-bonded onto a tape carrier was encapsulated with the encapsulating epoxy resin molding material of the invention; COB (chip on board) wherein a semiconductor chip connected by wire bonding, flip chip bonding or a solder to a wire formed on a circuit board or glass was encapsulated with the encapsulating epoxy resin molding material of the invention; a semiconductor device such as COG (chip on glass) having a bare chip mounted thereon; hybrid IC wherein an active element such as semiconductor chip, transistor, diode, thyristor etc. and/or a passive element such as capacitor, resistance element, coil etc., connected by wire bonding, flip chip bonding, a solder etc. to a wire formed on a circuit board or glass, was encapsulated with the encapsulating epoxy resin molding material of the invention; BGA (ball grid array) produced by installing a semiconductor chip on an interposer substrate having a terminal for connection to a MCM (multi chip module) mother board, then connecting the semiconductor chip by bumping or wire bonding to a wire formed on the interposer substrate and then encapsulating the semiconductor-installed side with the encapsulating epoxy resin molding material of the invention; CSP (chip size package); MCP (multi chip Package) etc. The semiconductor device may be a stacked package having two or more laminated elements installed on a mounted substrate or a mold array package having two or more elements encapsulated all at once with the encapsulating epoxy resin molding material.

FIG. 1 shows one example of the semiconductor device of the invention, but the semiconductor device of the invention is not limited thereto. FIG. 1 shows QFP produced by fixing a semiconductor chip 3 via a die bond 2 onto an island (tab) 1, then connecting a terminal (bonding pad) of the semiconductor chip 3 to a lead pin 4 via a wire 5 (wire bonding) and encapsulating the semiconductor chip with an encapsulating epoxy resin molding material (encapsulating material) 6, and FIG. 1(a) is a sectional view, (b) is a top view (partially perspective view), (c) is a top view (partially perspective view) of the enlarged terminal (bonding pad) 7 on the semiconductor chip 3.

The semiconductor device of the invention shown in FIG. 1 is preferably a thin semiconductor device wherein the thickness a of the encapsulating material 6 on the upper side of the semiconductor chip and/or the thickness b of the encapsulating material 6 on the lower side of the semiconductor chip is 0.7 mm or less, and may be 0.5 mm or less or 0.3 mm or less. The thickness of the package (total thickness of the semiconductor device) c is preferably 2.0 mm or less, more preferably 1.5 mm or less, and may be 1.0 mm or less.

The area d of the semiconductor chip is preferably 25 $mm^2$ or more and may be 50 $mm^2$ or more, or 80 $mm^2$ or more.

The semiconductor device is preferably a multi-pin type semiconductor device wherein the pin count 4 is 80 or more, and may be 100 or more or 200 or more.

The length of the wire for connecting the semiconductor chip to the lead pin is preferably 2 mm or more, and may be 3 mm or more, or 5 mm or more.

The pitch e between bonding pads on the semiconductor chip is preferably 90 μm or less, and may be 80 μm or less, or 60 μm or less.

Figure 3:
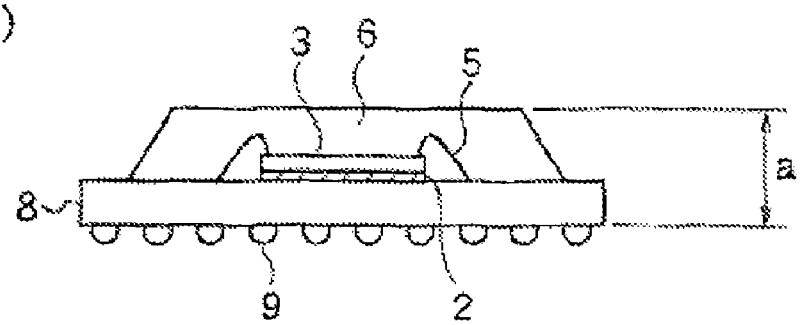
FIG. 3 shows (a) a sectional view, (b) an upper-surface (partially see-through) view and (c) an enlarged view of a region of bonding pads in a semiconductor device (BGA).
Figure 3:
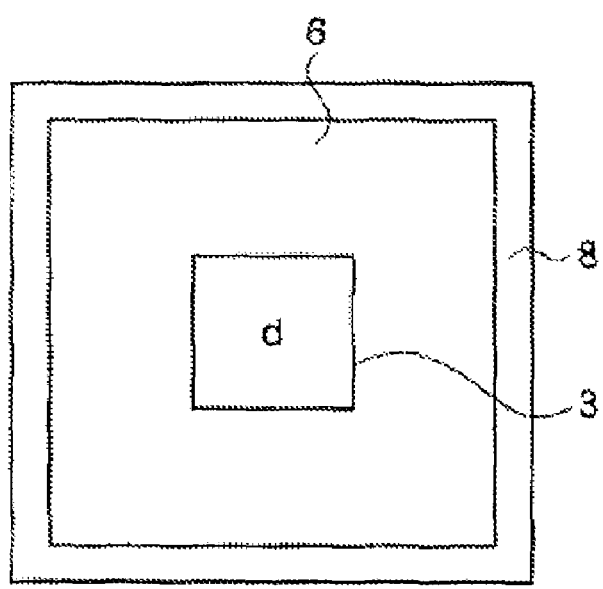
Figure 3:
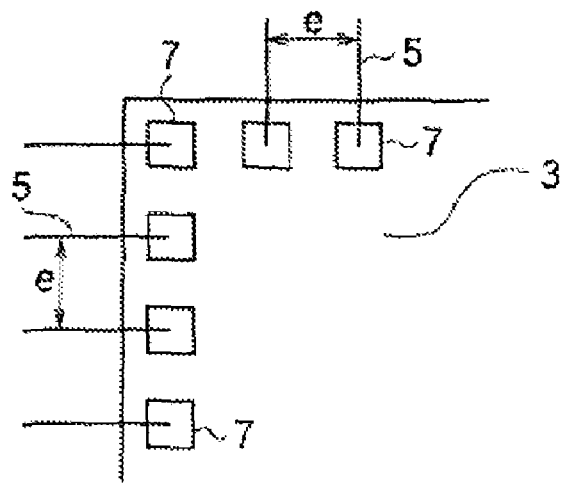
Figure 5:
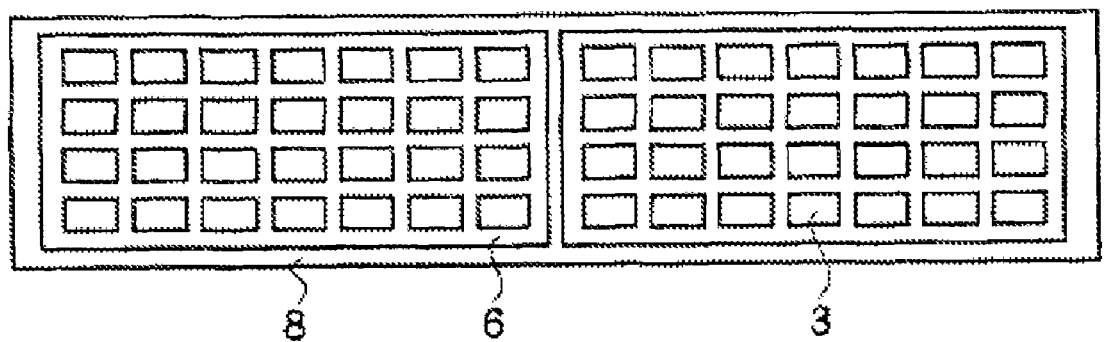
FIG. 5 is a drawing of a mold array package type BGA device.
Figure 5:
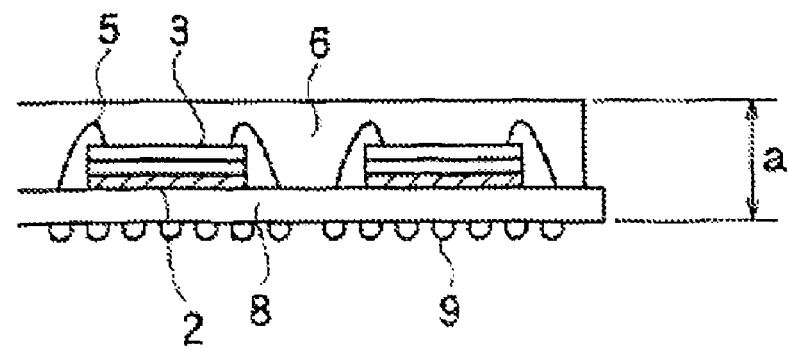

FIG. 3 and FIG. 5 show other examples of the semiconductor device of the invention, but the semiconductor device of the invention is not limited thereto. An element having the same function as in FIG. 1 is given the same symbol and its description is omitted.

FIG. 3 shows BGA produced by fixing a semiconductor chip 3 via a die attach 2 onto an insulating base substrate 8, then connecting a terminal (bonding pad) of the semiconductor chip 3 to a terminal on the circuit board via a wire 5 (by wire bonding) and encapsulating the semiconductor chip with an encapsulating epoxy resin molding material (encapsulating material) 6, and (a) shows a sectional view, (b) is a partially perspective, top view, and (c) is an enlarged view of the bonding pad. In FIG. 3, 9 is a solder ball.

In the semiconductor device shown in FIG. 3, the thickness a of the package is preferably 2 mm or less, and may be 1.5 mm or less, or 1.0 mm or less.

The area d of the semiconductor chip is preferably 25 $mm^2$ or more and may be 50 $mm^2$ or more, or 80 $mm^2$ or more.

The length of the wire 5 for connecting the semiconductor chip to the lead pin is preferably 2 mm or more, and may be 3 mm or more, or 5 mm or more.

The pitch e between bonding pads on the semiconductor chip is preferably 90 μm or less, and may be 80 μm or less, or 60 μm or less.

FIG. 5 shows mold array package type stacked BGA, and (a) is a top view (partially perspective view), and (b) is a partially enlarged, sectional view. In FIG. 5, 9 is a solder ball.

The semiconductor device shown in FIG. 5 should be a semiconductor device wherein the thickness a of the package is 2 mm or less, and the thickness of the package may be 1.5 mm or less, or 1.0 mm or less.

By encapsulating a semiconductor device with the semiconductor encapsulating epoxy resin molding material of the invention, it is possible to reduce molding defects such as wire sweep and voids even on a thin semiconductor having the thickness of the encapsulating material described above, on a semiconductor device having the thickness of the encapsulating material described above and the area of the semiconductor chip described above, and a semiconductor device having the number of pins, the length of the wire and the pad pitch described above.

Hereinafter, this invention is described by Examples, which however are not intended to limit the scope of this invention.

EXAMPLES (I-1 to I-5)

Comparative Examples (I-1 to I-15)

(A-I) Preparation of Encapsulating Epoxy Resin Molding Materials

Epoxy resins such as a biphenyl type epoxy resin having an epoxy equivalent of 196, a melting point of 106° C. and a melt viscosity (ICI viscosity) at 150° C. of 0.1 poise (trade name: Epicoat YX-4000H, manufactured by Yuka Shell Epoxy Co., Ltd.), a bisphenol F type epoxy resin having an epoxy equivalent of 186, a melting point of 75° C. and a melt viscosity (ICI viscosity) at 150° C. of 0.1 poise (trade name: YSLV-80XY, manufactured by Nippon Steel Chemical Co., Ltd.), a stilbene type epoxy resin having an epoxy equivalent of 210, a melting point of 120° C. and a melt viscosity (ICI viscosity) at 150° C. of 0.1 poise (trade name: ESLV-210, manufactured by Sumitomo Chemical Co., Ltd.), an o-cresol novolak type epoxy resin having an epoxy equivalent of 195, a softening point of 65° C. and a melt viscosity (ICI viscosity) at 150° C. of 2.0 poises (trade name: ESCN-190, manufactured by Sumitomo Chemical Co., Ltd.) and an bisphenol A type brominated epoxy resin having an epoxy equivalent of 375, a softening point of 80° C., a melt viscosity (ICI viscosity) at 150° C. of 1.3 poises and a bromine content of 48% by weight (trade name: ESB-400T, manufactured by Sumitomo Chemical Co., Ltd.);

curing agents such as a phenol-aralkyl resin having a softening point of 70° C., a hydroxyl equivalent of 175 and a melt viscosity (ICI viscosity) at 150° C. of 2.0 poises (trade name: Milex XL-225, manufactured by Mitsui Chemicals, Inc.), a biphenyl type phenol resin having a softening point of 80° C., a hydroxyl equivalent of 199 and a melt viscosity (ICI viscosity) at 150° C. of 1.4 poises (trade name: MEH-7851, manufactured by Meiwa Plastic Industries, Ltd.) and a phenol novolak resin having a softening point of 80° C., a hydroxyl equivalent of 106 and a melt viscosity (ICI viscosity) at 150° C. of 1.8 poises (trade name: H-1, manufactured by Meiwa Plastic Industries, Ltd.);

a curing accelerator such as triphenyl phosphine;

coupling agents such as γ-anilinopropyl trimethoxysilane (secondary amino silane), γ-aminopropyl trimethoxysilane (primary amino silane), γ-(N-methyl)anilinopropyl trimethoxysilane (tertiary amino silane) and γ-glycidoxypropyltrimethoxy silane (epoxy silane);

an inorganic filler of spherical fused silica having an average particle diameter of 17.5 μm and a specific surface area of 3.8 $m^2/g$ and other additives such as antimony trioxide, carnauba wax (manufactured by K.K. Serarika NODA) and carbon black (trade name: MA-100, manufactured by Mitsubishi Chemical Corporation) were compounded in the amounts "part by weight" shown in Table 1 and then kneaded with rolls at a kneading temperature of 80° C. for a kneading time of 10 minutes, to prepare encapsulating epoxy resin molding materials I-1 to I-10 (I-6 to I-10 are Comparative Examples).

TABLE 1

Compositions of encapsulating epoxy resin molding materials (parts by weight)

Encapsulating epoxy resin molding materials I

| Components | 1 | 2 | 3 | 4 | 5 | 6 | 7 | 8 | 9 | 10 |
|---|---|---|---|---|---|---|---|---|---|---|
| Biphenyl type epoxy resin | 85 | 85 | — | — | — | 85 | 85 | 85 | 85 | — |
| Bisphenol F type epoxy resin | — | — | 85 | — | — | — | — | — | — | — |
| Stilbene type epoxy resin | — | — | — | 85 | — | — | — | — | — | — |
| o-Cresol novolak type epoxy resin | — | — | — | — | 85 | — | — | — | — | 85 |
| Brominated epoxy resin | 15 | 15 | 15 | 15 | 15 | 15 | 15 | 15 | 15 | 15 |
| Phenol-aralkyl resin | 83 | — | 87 | 78 | — | 83 | 83 | 83 | — | — |
| Biphenyl phenol resin | — | 94 | — | — | — | — | — | — | 94 | — |
| Phenol novolak resin | — | — | — | — | 50 | — | — | — | — | 50 |
| Curing accelerator | 3.5 | 3.5 | 3.5 | 3.5 | 3.5 | 3.5 | 3.5 | 3.5 | 3.5 | 3.5 |
| Secondary amino silane | 4.5 | 4.5 | 4.5 | 4.5 | 4.5 | — | — | — | — | — |
| Primary amino silane | — | — | — | — | — | — | — | 4.5 | — | — |
| Tertiary amino silane | — | — | — | — | — | — | 4.5 | — | — | — |
| Epoxy silane | — | — | — | — | — | 4.5 | — | — | 4.5 | 4.5 |
| Fused silica | 1507 | 1593 | 1538 | 1469 | 737 | 1507 | 1507 | 1507 | 1593 | 737 |
| Antimony trioxide | 6.0 | 6.0 | 6.0 | 6.0 | 6.0 | 6.0 | 6.0 | 6.0 | 6.0 | 6.0 |
| Carnauba wax | 2.0 | 2.0 | 2.0 | 2.0 | 2.0 | 2.0 | 2.0 | 2.0 | 2.0 | 2.0 |
| Carbon wax | 3.5 | 3.5 | 3.5 | 3.5 | 3.5 | 3.5 | 3.5 | 3.5 | 3.5 | 3.5 |
| Amount of inorganic filler (weight-%) | 88 | 88 | 88 | 88 | 81 | 88 | 88 | 88 | 88 | 81 |

Test Example 1

The characteristics of the encapsulating epoxy resin molding materials (I-1) to (I-10) prepared above were examined in the following tests. The results are shown in Table 2.

(1) Spiral Flow

The encapsulating epoxy resin molding material was molded with a mold for measuring spiral flow according to EMMI-1-66 by a transfer molding machine at a mold temperature of 180° C., at a molding pressure of 6.9 MPa for a curing time of 90 seconds, and then the distance of flow (cm) was determined.

(2) Disk Flow

Using a disk flow-measuring flat mold having an upper mold of 200 mm (W)×200 mm (D)×25 mm (H) and a lower mold of 200 mm (W)×200 mm (D)×15 mm (H), the weighed sample (encapsulating epoxy resin molding material) 5 g, was placed on the center of the lower mold heated at 180° C.; and 5 seconds later, the upper mold heated at 180° C. was closed; and the sample was compression-molded under a loading of 78 N for a curing time of 90 seconds; and the major axis (mm) and the minor axis (mm) of the molded product were measured with calipers, and their average value (mm) was determined as disk flow.

TABLE 2

Characteristics of the encapsulating epoxy resin molding materials

| Characteristics | Encapsulating epoxy resin molding materials I | | | | | | | | | |
|---|---|---|---|---|---|---|---|---|---|---|
| | 1 | 2 | 3 | 4 | 5 | 6 | 7 | 8 | 9 | 10 |
| Spiral flow (cm) | 107 | 112 | 115 | 113 | 113 | 89 | 94 | —* | 90 | 85 |
| Disk flow (mm) | 83 | 87 | 92 | 90 | 89 | 73 | 75 | —* | 76 | 70 |

(*The encapsulating epoxy resin molding material I-8 could not be measured due to gelation.)

(B-I) Preparation of Semiconductor Devices

Using the encapsulating epoxy resin molding materials I-1 to I-10, the semiconductor devices in Examples I-1 to I-5 and Comparative Examples I-1 to I-15 were prepared. Encapsulation in the encapsulating epoxy resin molding material was carried out by molding at a mold temperature of 180° C., at a molding pressure of 6.9 MPa for a curing time of 90 seconds in a transfer molding machine, followed by post-curing at 180° C. for 5 hours.

Using the encapsulating epoxy resin molding materials I-1 to I-5, the thin, multi-pin, long wire and narrow-pad-pitch semiconductor devices in Examples I-1 to I-5 (100-pin LQFP) having 100 lead pins and an external dimension of 20 mm×20 mm and a total thickness of 1.5 mm, mounted with a test silicone chip of 10 mm×10 mm×0.4 mm (area 100 mm$^2$) with a bonding pad pitch of 80 μm, subjected to wire bonding with a wire of 18 μm in diameter and 3 mm in length and having the encapsulating material of 0.5 mm in thickness on the upper side of the semiconductor chip and the encapsulating material of 0.5 mm in thickness on the lower side of the semiconductor chip, were prepared.

Using the encapsulating epoxy resin molding materials I-6 to I-10, the thin, multi-pin, long wire and narrow-pad-pitch semiconductor devices in Comparative Examples I-1 to I-5 (100-pin LQFP) with 100 lead pins were prepared in the same manner as in Examples I-1 to I-5.

Using the encapsulating epoxy resin molding materials I-1 to I-10, the semiconductor devices in Comparative Examples I-6 to I-16 (64-pin QFP-1H) having 64 lead pins and an external dimension of 20 mm×20 mm and a total thickness of 2.7 mm, mounted with a test silicone chip of 4 mm×4 mm×0.4 mm (area 16 mm$^2$) with a bonding pad pitch of 100 μm, subjected to wire bonding with a wire of 18 μm in diameter and 1.5 mm in length and having the encapsulating material of 1.1 mm in thickness on the upper side of the semiconductor chip and the encapsulating material of 1.1 mm in thickness on the lower side of the semiconductor chip, were prepared.

Test Example 2

The prepared semiconductor devices in Examples I-1 to I-5 and Comparative Examples I-1 to I-15 were evaluated by the following tests. The evaluation results are shown in Tables 3 and 4.

(1) Wire Sweep (Indicator of Wire Sweep)

Figure 2:
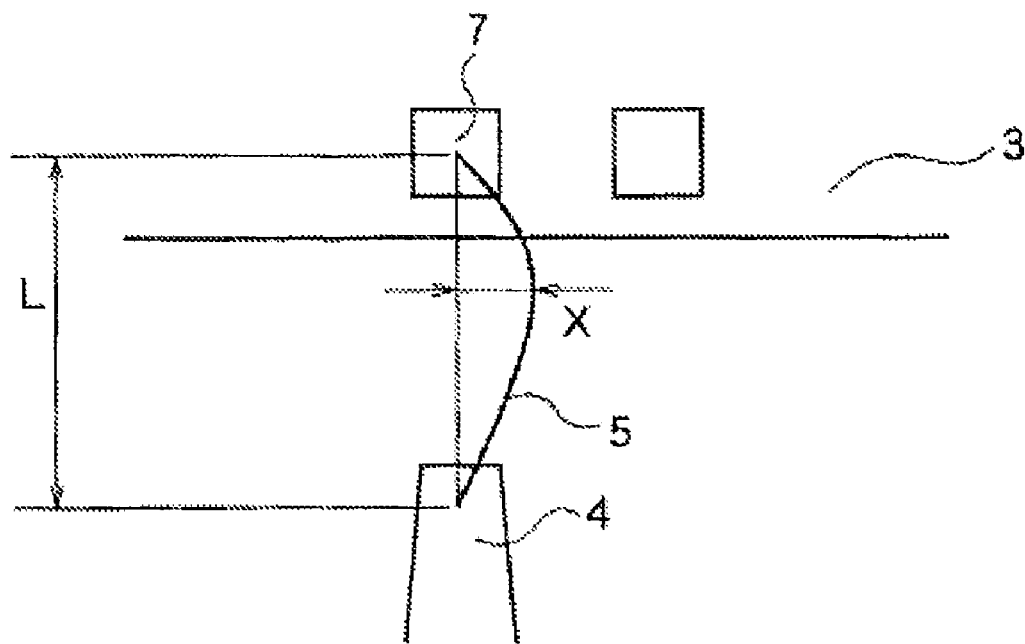
FIG. 2 is a drawing showing a method of measuring the wire sweep.
Figure 4:
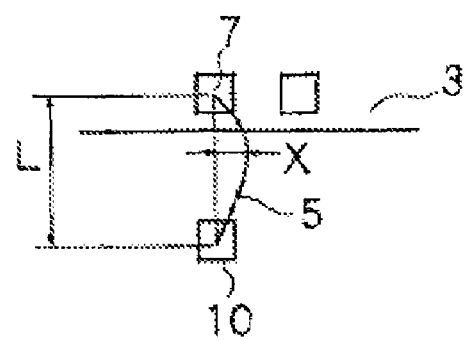
FIG. 4 is a drawing showing a method of measuring the deformation of a wire.

Using a soft-X-ray measuring device (PRO-TEST 100 type, manufactured by Softex Co., Ltd.), the semiconductor device was examined for Wire sweep by fluroscopic observation at a voltage of 100 kV at a current of 1.5 mA, to evaluate wire sweep. As shown in FIG. 2 or 4, the observation was carried in a direction perpendicular to the frame surface, and the minimum distance L of the wire bonding (that is, the distance between the terminal 7 of the semiconductor chip 3 and the lead pin 4 or the bonded region of the terminal 10 on the wiring board) and the maximum deformation X of the wire 5 were measured, and X/L×100 was calculated as wire deformation (%).

(2) Void Generation

The X-ray examination of the semiconductor device was carried out in the same manner as in (1) above, and whether voids of 0.1 mm or more in diameter had been generated or not was observed, and void generation was evaluated in terms of the number of semiconductor devices with voids/the number of test semiconductor devices.

therein, were excellent in moldability with no wire sweep (minimum wire deformation) without generating voids.

The semiconductor devices in Comparative Examples I-6 to I-15, wherein the constitution of the semiconductor, with respect to the thickness of the encapsulating material, the length of the wire, the pin count, the pitch of pads, the thickness of the package, etc., was outside of the range defined in this invention, were excellent in moldability with no wire sweep(minimum wire deformation) without generating voids, except for the molding inability due to gelation in Comparative Example I-13 using encapsulation in the comparative encapsulating epoxy resin molding material I-8 containing a primary amino silane coupling agent in place of the silane coupling agent containing a secondary amino group.

EXAMPLES II-1 to II-10

Comparative Examples II-1 to II-30

(B-II) Preparation of Semiconductor Devices

Using the encapsulating epoxy resin molding materials I-1 to I-10, the semiconductor devices in Examples II-1 to II-10 and Comparative Examples II-1 to II-30 were prepared. Encapsulation in the encapsulating epoxy resin molding material was carried out by molding at a mold temperature of

TABLE 3

Evaluation result 1 of the semiconductor devices

| Characteristics | Examples I | | | | | Comparative Examples I | | | | |
|---|---|---|---|---|---|---|---|---|---|---|
| | 1 | 2 | 3 | 4 | 5 | 1 | 2 | 3 | 4 | 5 |
| Encapsulating epoxy resin molding materials I | 1 | 2 | 3 | 4 | 5 | 6 | 7 | 8 | 9 | 10 |
| Wire sweep (%) | 5 | 3 | 2 | 2 | 2 | 14 | 11 | not moldable | 12 | 18 |
| Void generation | 0/20 | 0/20 | 0/20 | 0/20 | 0/20 | 4/20 | 3/20 | | 2/20 | 5/20 |

TABLE 4

Evaluation result 2 of the semiconductor devices

| Characteristics | Examples I | | | | | Comparative Examples I | | | | |
|---|---|---|---|---|---|---|---|---|---|---|
| | 6 | 7 | 8 | 9 | 10 | 11 | 12 | 13 | 14 | 15 |
| Encapsulating epoxy resin molding materials I | 1 | 2 | 3 | 4 | 5 | 6 | 7 | 8 | 9 | 10 |
| Wire sweep (%) | 0 | 0 | 0 | 0 | 0 | 5 | 3 | not moldable | 4 | 7 |
| Void generation | 0/20 | 0/20 | 0/20 | 0/20 | 0/20 | 0/20 | 0/20 | | 0/20 | 0/20 |

The thin, multi-pin, long wire and narrow-pad-pitch semiconductor devices in Comparative Examples I-1 to I-5, which had been encapsulated in the encapsulating epoxy resin molding materials I-6 to I-10 containing neither the silane coupling agent having a secondary amino group (C) nor the phosphate (D), generated the molding defect of either wire sweep (high wire deformation) and void generation or a molding inability due to gelation.

On the other hand, the encapsulating epoxy resin molding materials I-1 to I-5 containing the epoxy resin (A), the curing agent (B) and the silane coupling agent having a secondary amino group (C) were excellent in fluidity, and the thin, multi-pin, long wire and narrow-pad-pitch semiconductor devices in Examples I-1 to I-5, which had been encapsulated 180° C., at a molding pressure of 6.9 MPa for a curing time of 90 seconds in a transfer molding machine, followed by post-curing at 180° C. for 5 hours.

Preparation of OMPAC Type BGA

The semiconductor devices (OMPAC type BGA) having a package thickness of 1.5 mm in Examples II-1 to II-5 were prepared in the following manner.

An insulating base substrate (glass cloth-epoxy resin laminated plate available under the trade name E-679, manufactured by Hitachi Chemical Co., Ltd.) was provided with a fine wiring pattern, then coated with an insulating protective resist (trade name: PSR4000AUS5, manufactured by TAIYO INK MFG. CO. LTD.) on the surface thereof, except for metal-plated terminals at a semiconductor chip-mounting side and external connecting terminals at its opposite side, and dried at 120° C. for 2 hours. The resulting semiconductor chip-mounting substrate having an external dimension of 26.2 mm×26.2 mm×0.6 mm thickness was coated with an adhesive (trade name: EN-X50, manufactured by Hitachi Chemical Co., Ltd.), then mounted with a semiconductor chip having a chip size of 9 mm×9 mm×0.51 mm thickness (area 81 mm$^2$) and a pad pitch of 80 μm. The semiconductor chip-mounting substrate was then heated at a predetermined rate of increasing temperature from room temperature to 180° C. in 1 hour in a clean oven, further heated at 180° C. for 1 hour and subjected to wire bonding with a metal wire of 30 μm in diameter and 5 mm in length. Then the encapsulating epoxy resin molding materials I-1 to I-5 were transfer-molded to a dimension of 26.2 mm×26.2 mm×0.9 mm thickness on the semiconductor chip-mounted surface under the conditions described above.

Using the semiconductor epoxy resin molding materials I-6 to I-10, the semiconductor devices (OMPAC type BGA) having a package thickness of 1.5 mm in Comparative Examples 1 to 5 were prepared in the same manner as in Examples II-1 to II-5.

The semiconductor devices (OMPAC type BGA) having a package thickness of 2.5 mm in Comparative Examples II-6 to II-15 were prepared by transfer-molding the encapsulating epoxy resin molding materials 1 to 10 to a dimension of 26.2 mm×26.2 mm×1.9 mm thickness on the semiconductor chip-mounted surface under the above-described conditions in the same manner as in Examples II-1 to II-5, except that a semiconductor chip having a chip size of 4 mm×4 mm×0.51 mm thickness (area 16 mm$^2$) and a pad pitch of 100 μm, and a metal wire of 30 μm in diameter and 1.5 mm in length, were used.

Preparation of Mold Array Package Type Stacked BGA

The semiconductor devices (mold array package type stacked BGA) having a package thickness of 0.95 mm in Examples II-6 to II-10 were prepared in the following manner.

Two semiconductor chips having a chip size of 9.7 mm×6.0 mm×0.4 mm thickness (area 58 mm$^2$) and a pad pitch of 80 μm, having a die attach film (trade name: DF-400, manufactured by Hitachi Chemical Co., Ltd.) applied on the back thereof, were layered and arranged on a polyimide substrate of length 48 mm×width 171 mm×thickness 0.15 mm, as shown in FIG. 2. The semiconductor chip-mounting substrate was then contact-bonded at a contact-bonding pressure of 200° C. under a loading of 1.96 N for a contact-bonding time of 10 seconds; further baked at 180° C. for 1 hour, and then subjected to wire-bonding with a metal wire of 30 μm in diameter and 5 mm in length, followed by transfer-molding the encapsulating epoxy resin molding materials I-1 to I-5 to a dimension of length 40 mm×width 83 mm×thickness 0.8 mm on the surface mounted with the semiconductor chips under the conditions described above.

Using the semiconductor epoxy resin molding materials I-6 to I-10, the semiconductor devices (mold array package type stacked BGA) having a package thickness of 0.95 mm in Comparative Examples II-16 to II-20 were prepared in the same manner as in Examples II-6 to II-10.

Further, the semiconductor devices (mold array package type stacked BGA) having a package thickness of 2.65 mm in Comparative Examples II-21 to II-30 were prepared by transfer-molding the encapsulating epoxy resin molding materials I-1 to I-10 to a dimension of length 40 mm×width 83 mm×thickness 2.5 mm on the surface mounted with semiconductor chips under the above-described conditions in the same manner as in Examples II-6 to II-10, except that semiconductor chips having a chip size of 5.1 mm×3.1 mm×0.4 mm thickness (area 16 mm$^2$) and a pad pitch of 100 μm, and a metal wire of 30 μm in diameter and 1.5 mm in length, were used.

The prepared semiconductor devices in Examples II-1 to II-10 and Comparative Examples II-1 to II-30 were evaluated for (1) wire sweep (indicator of wire sweep) and (2) the number of generated voids by the test method 2 described above. The evaluation results are shown in Tables 5 to 8.

TABLE 5

Evaluation result 1 of the semiconductor devices

| Characteristics | Examples II | | | | | Comparative Examples II | | | | |
| --- | --- | --- | --- | --- | --- | --- | --- | --- | --- | --- |
| | 1 | 2 | 3 | 4 | 5 | 1 | 2 | 3 | 4 | 5 |
| Encapsulating epoxy resin molding materials I | 1 | 2 | 3 | 4 | 5 | 6 | 7 | 8 | 9 | 10 |
| Wire sweep (%) | 7 | 5 | 3 | 4 | 3 | 16 | 15 | Not moldable | 14 | 20 |
| Void generation | 0/20 | 0/20 | 0/20 | 0/20 | 0/20 | 5/20 | 4/20 | Not moldable | 3/20 | 7/20 |

TABLE 6

Evaluation result 2 of the semiconductor devices

| Characteristics | Comparative Examples II | | | | | | | | | |
| --- | --- | --- | --- | --- | --- | --- | --- | --- | --- | --- |
| | 6 | 7 | 8 | 9 | 10 | 11 | 12 | 13 | 14 | 15 |
| Encapsulating epoxy resin molding materials I | 1 | 2 | 3 | 4 | 5 | 6 | 7 | 8 | 9 | 10 |
| Wire sweep (%) | 2 | 1 | 0 | 0 | 1 | 7 | 6 | Not moldable | 4 | 8 |
| Void generation | 0/20 | 0/20 | 0/20 | 0/20 | 0/20 | 0/20 | 0/20 | Not moldable | 0/20 | 3/20 |

TABLE 7

Evaluation result 3 of the semiconductor devices

| | Examples II | | | | | Comparative Examples II | | | | |
|---|---|---|---|---|---|---|---|---|---|---|
| Characteristics | 6 | 7 | 8 | 9 | 10 | 16 | 17 | 18 | 19 | 20 |
| Encapsulating epoxy resin molding materials I | 1 | 2 | 3 | 4 | 5 | 6 | 7 | 8 | 9 | 10 |
| Wire sweep (%) | 8 | 7 | 6 | 6 | 6 | 18 | 17 | Not moldable | 15 | 22 |
| Void generation | 0/20 | 0/20 | 0/20 | 0/20 | 0/20 | 8/20 | 6/20 | | 5/20 | 9/20 |

TABLE 8

Evaluation result 4 of the semiconductor devices

| | Comparative Examples II | | | | | | | | | |
|---|---|---|---|---|---|---|---|---|---|---|
| Characteristics | 21 | 22 | 23 | 24 | 25 | 26 | 27 | 28 | 29 | 30 |
| Encapsulating epoxy resin molding materials I | 1 | 2 | 3 | 4 | 5 | 6 | 7 | 8 | 9 | 10 |
| Wire sweep (%) | 3 | 3 | 2 | 2 | 2 | 9 | 7 | Not moldable | 6 | 9 |
| Void generation | 0/20 | 0/20 | 0/20 | 0/20 | 0/20 | 0/20 | 0/20 | | 0/20 | 2/20 |

The thin semiconductor devices in Comparative Examples II-1 to II-5 and Comparative Examples II-16 to II-20, which had been encapsulated in the encapsulating epoxy resin molding materials I-6 to I-10 containing neither the silane coupling agent having a secondary amino group (C) nor the phosphate (D), generated the molding defect of either wire sweep (high wire deformation) and void generation or a molding inability due to gelation.

On the other hand, the encapsulating epoxy resin molding materials II-1 to II-5 containing the epoxy resin (A), the curing agent (B) and the silane coupling agent having a secondary amino group (C) were excellent in fluidity, and the thin semiconductor devices in Examples II-1 to II-10, which had been encapsulated therein, were excellent in moldability with no wire sweep(minimum wire deformation) without generating voids.

The semiconductor devices in Comparative Examples II-6 to II-15 and Comparative Examples II-21 to II-30, wherein the thickness of the package was outside of the range defined in this invention, were excellent in moldability with no wire sweep (minimum wire deformation) without generating voids, except for the molding inability due to gelation in Comparative Example II-13 and II-28 using encapsulation in the comparative encapsulating epoxy resin molding material 8 containing a primary amino silane coupling agent in place of the silane coupling agent containing a secondary amino group.

EXAMPLES III-1 TO III-9

Comparative Examples III-1 TO III-4

(A-III) Preparation of Encapsulating Epoxy Resin Molding Materials

The respective components shown below were compounded in the amounts (parts by weight) shown in Table 13 and kneaded with rolls at a kneading temperature of 80° C. for a kneading time of 10 minutes to prepare encapsulating epoxy resin molding materials III-1 to III-9 (Examples III-1 to III-9) and molding materials III-10 to III-13 (Comparative Examples III-1 to III-4).

(A) Epoxy Resin (A-1) A biphenyl type epoxy resin having an epoxy equivalent of 196, a melting point of 106° C. and a melt viscosity (ICI viscosity) at 150° C. of $0.1 \times 10^{-1}$ Pas (trade name: Epicoat YX-4000H, manufactured by Yuka Shell Epoxy Co., Ltd.)

(A-2) A bisphenol F type epoxy resin having an epoxy equivalent of 186, a melting point of 75° C. and a melt viscosity (ICI viscosity) at 150° C. of $0.1 \times 10^{-1}$ Pas (trade name: YSLV-80XY, manufactured by Nippon Steel Chemical Co., Ltd.)

(A-3) A stilbene type epoxy resin having an epoxy equivalent of 210, a melting point of 120° C. and a melt viscosity (ICI viscosity) at 150° C. of $0.1 \times 10^{-1}$ Pas (tradename: ESLV-210, manufactured by Sumitomo Chemical Co., Ltd.)

(A-4) An o-cresol novolak type epoxy resin having an epoxy equivalent of 195, a softening point of 65° C. and a melt viscosity (ICI viscosity) at 150° C. of $2.0 \times 10^{-1}$ Pas (trade name: ESCN-190, manufactured by Sumitomo Chemical Co., Ltd.)

(A-5) An bisphenol A type brominated epoxy resin having an epoxy equivalent of 375, a softening point of 80° C., a melt viscosity (ICI viscosity) at 150° C. of $1.3 \times 10^{-1}$ Pas and a bromine content of 48% by weight (trade name: ESB-400T, manufactured by Sumitomo Chemical Co., Ltd.)

(B) Curing Agent (B-1) A phenol-aralkyl resin having a softening point of 70° C., a hydroxyl equivalent of 175 and a melt viscosity (ICI viscosity) at 150° C. of $2.0 \times 10^{-1}$ Pas (trade name: Milex XL-225, manufactured by Mitsui Chemicals, Inc.)

(B-2) A biphenyl type phenol resin having a softening point of 80° C., a hydroxyl equivalent of 199 and a melt viscosity (ICI viscosity) at 150° C. of $1.4 \times 10^{-1}$ Pas (trade name: MEH-7851, manufactured by Meiwa Plastic Industries, Ltd.)

(B-3) A phenol novolak resin having a softening point of 80° C., a hydroxyl equivalent of 106 and a melt viscosity (ICI viscosity) at 150° C. of $1.8 \times 10^{-1}$ Pas (trade name: H-1, manufactured by Meiwa Kasei Co., Ltd.)

(B-4) A melamine phenol resin having a softening point of 81° C., a hydroxyl equivalent of 120 and a melt viscosity (ICI viscosity) at 150° C. of 2.0×10$^{-1}$ Pas (trade name: Phenolite KA-7052-L2, manufactured by Dainippon Ink and Chemicals, Incorporated)

(D) Phosphate (D-1) Aromatic condensed phosphate (trade name: PX-200, manufactured by Daihachi Chemical Industry Co., LTD)

(D-2) Triphenyl phosphate (E) Inorganic Filler (E-1) Spherical fused silica having an average particle diameter of 17.5 μm and a specific surface area of 3.8 m$^2$/g (F) Curing Accelerator (F-1) Triphenyl phosphine (G) Coupling Agent (G-1) γ-Glycidoxypropyl trimethoxysilane (epoxy silane)

(H) Flame-Retardant (H-1) Composite metal hydroxide (trade name: Echomug Z-10, manufactured by Tateho Chemical Industries Co., LTD)

(I) Other Additives (I-1) Antimony trioxide (I-2) Carnauba wax (manufactured by K.K. Serarika NODA).

(I-3) Carbon black (trade name: MA-100, manufactured by Mitsubishi Chemical Corporation)

TABLE 9

| Compounding Components | Molding Material No. III | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | Examples III | | | | | | | | | Comparative Examples III | | | |
| | 1 | 2 | 3 | 4 | 5 | 6 | 7 | 8 | 9 | 1 | 2 | 3 | 4 |
| (A-1) (parts by weight) | 100 | 100 | 100 | 100 | 100 | — | — | — | 85 | 100 | 100 | 85 | — |
| (A-2) (parts by weight) | — | — | — | — | — | 100 | — | — | — | — | — | — | — |
| (A-3) (parts by weight) | — | — | — | — | — | — | 100 | — | — | — | — | — | — |
| (A-4) (parts by weight) | — | — | — | — | — | — | — | 100 | — | — | — | — | 85 |
| (A-5) (parts by weight) | — | — | — | — | — | — | — | — | 15 | — | — | 15 | 15 |
| (B-1) (parts by weight) | 89 | 80 | 89 | 89 | — | 94 | 83 | — | 83 | 89 | 89 | 83 | — |
| (B-2) (parts by weight) | — | — | — | — | 102 | — | — | — | — | — | — | — | — |
| (B-3) (parts by weight) | — | — | — | — | — | — | — | 54 | — | — | — | — | 50 |
| (B-4) (parts by weight) | — | 6 | — | — | — | — | — | — | — | — | — | — | — |
| (D-1) (parts by weight) | 25 | 25 | — | 10 | 25 | 25 | 25 | 40 | 10 | — | — | — | — |
| (D-2) (parts by weight) | — | — | 24 | — | — | — | — | — | — | — | — | — | — |
| (E-1) (parts by weight) | 1713 | 1690 | 1706 | 1570 | 1805 | 1749 | 1668 | 899 | 1582 | 1525 | 1425 | 1477 | 724 |
| (F-1) (parts by weight) | 3.5 | 3.5 | 3.5 | 3.5 | 3.5 | 3.5 | 3.5 | 2 | 3.5 | 3.5 | 3.5 | 3.5 | 2 |

TABLE 9-continued

| Compounding Components | Molding Material No. III | | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| | 1 | 2 | 3 | 4 | 5 | 6 | 7 | 8 | 9 | 1 | 2 | 3 | 4 |
| (G-1) (parts by weight) | 4.5 | 4.5 | 4.5 | 4.5 | 4.5 | 4.5 | 4.5 | 3 | 4.5 | 4.5 | 4.5 | 4.5 | 3 |
| (H-1) (parts by weight) | — | — | — | 30 | — | — | — | — | — | — | 100 | — | — |
| (I-1) (parts by weight) | — | — | — | — | — | — | — | — | 6 | — | — | — | 6 |
| (I-2) (parts by weight) | 2 | 2 | 2 | 2 | 2 | 2 | 2 | 2 | 2 | 2 | 2 | 2 | 2 |
| (I-3) (parts by weight) | 3.5 | 3.5 | 3.5 | 3.5 | 3.5 | 3.5 | 3.5 | 3.5 | 3.5 | 3.5 | 3.5 | 3.5 | 3.5 |
| (E-1) Content (weight-%) | 88 | 88 | 88 | 88 | 88 | 88 | 88 | 81 | 88 | 88 | 88 | 88 | 81 |

Test Example 3

The properties of the prepared encapsulating epoxy resin molding materials III-1 to III-13 were determined in the following tests. The results are shown in Table 14.

(1) Spiral Flow

The encapsulating epoxy resin molding material was molded with a spiral flow-measuring mold according to EMMI-1-66 by a transfer molding machine at a mold temperature of 180° C., at a molding pressure of 6.9 MPa for a curing time of 90 seconds, and then the distance of flow (cm) was determined.

(2) Disk Flow

Using a disk flow-measuring flat mold having an upper mold of 200 mm (W)×200 mm (D)×25 mm (H) and a lower mold of 200 mm (W)×200 mm (D)×15 mm (H), the weighed sample (encapsulating epoxy resin molding material) 5 g, was placed on the center of the lower mold heated at 180° C.; and 5 seconds later, the upper mold heated at 180° C. was closed; and the sample was compression-molded under a loading of 78 N for a curing time of 90 seconds; and the major axis (mm) and the minor axis (mm) of the molded product were measured with calipers, and their average value (mm) was determined as disk flow.

(3) Hardness Upon Heating

The encapsulating epoxy resin molding material was molded into a disk of 50 mm diameter×3 mm thickness under the above-described conditions, and immediately after molding, the disk was measured with a Shore D type hardness meter.

(4) Flame Retardancy

The encapsulating epoxy resin molding material was molded under the above-described conditions with a mold for molding a test specimen having a thickness of 1/16 inch, then cured at 180° C. for 5 hours and evaluated for flame retardancy according to an UL-94 test method.

TABLE 10

| Characteristics | Molding Material No. III | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | Comparative Examples III | | | |
| | 1 | 2 | 3 | 4 | 5 | 6 | 7 | 8 | 9 | 1 | 2 | 3 | 4 |
| Spiral flow (cm) | 117 | 110 | 120 | 102 | 119 | 123 | 115 | 113 | 105 | 93 | 87 | 89 | 85 |
| Disk flow (mm) | 92 | 85 | 90 | 83 | 95 | 98 | 89 | 88 | 82 | 75 | 68 | 73 | 70 |
| Hardness upon heating (Shore D) | 70 | 78 | 65 | 80 | 69 | 68 | 72 | 74 | 75 | 75 | 78 | 80 | 85 |
| UL-94 test | V-0 | V-0 | V-0 | V-0 | V-0 | V-0 | V-0 | V-0 | V-0 | V-1 | V-0 | V-0 | V-0 |

EXAMPLES III-10 TO III-27

Comparative Examples III-5 TO III-12

(B-III) Preparation of Semiconductor Devices Preparation of Semiconductor Devices (LQFP and QFP)

Using the encapsulating epoxy resin molding materials III-1 to III-9 (Examples III-10 to III-27) or the molding materials III-10 to III-13 (Comparative Examples III-5 to III-12), semiconductor devices were prepared in the following manner. Encapsulation in the encapsulating epoxy resin molding material was carried out by molding at a mold temperature of 180° C., at a molding pressure of 6.9 MPa for a curing time of 90 seconds in a transfer molding machine, followed by post-curing at 180° C. for 5 hours.

Using the encapsulating epoxy resin molding materials III-1 to III-9 (Examples III-10 to III-18) or the molding materials III-10 to III-13 (Comparative Examples III-5 to III-8), semiconductor devices (100-pin LQFP) having an external size of 20 mm×20 mm and a total thickness of 1.5 mm were prepared.

Said semiconductor devices were mounted with a test silicone chip of 10 mm×10 mm×0.4 mm (area 100 mm$^2$) with a pad pitch of 80 μm, subjected to wire bonding with a wire of 18 μm in diameter and 3 mm in maximum length and having the encapsulating material of 0.5 mm in thickness on the upper surface of the semiconductor chip and the encapsulating material of 0.5 mm in thickness on the back of the semiconductor chip.

Using the encapsulating epoxy resin molding materials III-1 to III-9 (Examples III-19 to III-27) or the molding materials III-10 to III-13 (Comparative Examples III-9 to III-12), the semiconductor devices (64-pin QFP-1H) in Comparative Examples III-5 to III-17 having an external size of 20 m×20 mm and a total thickness of 2.7 mm, mounted with a test silicone chip of 4 mm×4 mm×0.4 mm (area 16 mm$^2$) with a pad pitch of 100 μm, subjected to wire bonding with a wire of 18 μm in diameter and 1.5 mm in maximum length and having the encapsulating material of 1.1 mm in thickness on the upper surface of the semiconductor chip and the encapsulating material of 1.1 mm in thickness on the back of the semiconductor chip, were prepared.

EXAMPLES III-28 TO III-45

Comparative Examples III-13 TO III-20

Preparation of Semiconductor Devices (OMPAC Type BGA)

Using the encapsulating epoxy resin molding materials III-1 to III-9 (Examples III-28 to III-45) or the molding materials III-10 to III-13 (Comparative Examples III-13 to III-20), semiconductor devices were prepared in the following manner. Encapsulation in the encapsulating epoxy resin molding material was carried out by molding at a mold temperature of 180° C., at a molding pressure of 6.9 MPa for a curing time of 90 seconds in a transfer molding machine, followed by post-curing at 180° C. for 5 hours.

An insulating base substrate (glass cloth-epoxy resin laminated plate available under the trade name E-679, manufactured by Hitachi Chemical Co., Ltd.) was provided with a fine wiring pattern, then coated with an insulating protective resist (trade name: PSR4000AUS5, manufactured by TAIYO INK MFG. CO. LTD.) on the surface thereof, except for metal-plated terminals at a semiconductor chip-mounting side and external connecting terminals at its opposite side. The resulting semiconductor element-mounting substrate having an external dimension of length 26.2 mm×width 26.2 mm×thickness 0.6 mm was dried at 120° C. for 2 hours, then coated with an adhesive (trade name: EN-X50, manufactured by Hitachi Chemical Co., Ltd.), mounted with a semiconductor element having a size of length 9 mm×width 9 mm×thickness 0.51 mm (area 81 mm$^2$) and a pad pitch of 80 μm. The semiconductor element-mounting substrate was heated at a predetermined rate of increasing temperature from room temperature to 180° C. in 1 hour in a clean oven, further heated at a constant temperature of 180° C. for 1 hour. Thereafter, the wire bonding region and the semiconductor element were wire-bonded with a metal wire of 30 μm in diameter and 5 mm in maximum length. Then, the encapsulating epoxy resin molding materials 1 to 9 were transfer-molded to a dimension of length 26.2 mm×width 26.2 mm×thickness 0.9 mm on the semiconductor element-mounted surface (BGA device of 1.5 mm in thickness) under the conditions described above, whereby the BGA devices in Examples III-28 to III-36 were prepared.

Using the molding materials III-10 to III-13 in place of the molding materials III-1 to III-9, the semiconductor devices in Comparative Examples III-13 to III-16 were prepared in the same manner as in Examples III-28 to III-36.

Further, a substrate mounted with a semiconductor element of length 4 mm×width 4 mm×thickness 0.51 mm (area 16 mm$^2$) with a pad pitch of 100 μm, wherein the wire bonding region and the semiconductor element were wire-bonded with a metal wire of 30 μm in diameter and 1.5 mm in maximum length, was prepared in the same manner as in Examples III-28 to III-36. And then the encapsulating epoxy resin molding materials III-1 to III-9 or III-10 to III-13 were transfer-molded to a dimension of length 26.2 mm×width 26.2 mm×thickness 1.9 mm on the semiconductor element-mounted surface (BGA device of 2.5 mm in thickness) under the above-described conditions, whereby the BGA devices in Examples III-37 to III-45 or Comparative Examples III-17 to III-20 were prepared.

EXAMPLES III-46 TO III-63

Comparative Examples III-21 TO III-28

Preparation of Semiconductor Devices (Mold Array Package Type Stacked BGA)

Using the encapsulating epoxy resin molding materials III-1 to III-9 (Examples III-46 to III-63) or the molding materials III-10 to III-13 (Comparative Examples III-21 to III-28), semiconductor devices were prepared in the following manner. Encapsulation in the encapsulating epoxy resin molding material was carried out by molding at a mold temperature of 180° C., at a molding pressure of 6.9 MPa for a curing time of 90 seconds in a transfer molding machine, followed by post-curing at 180° C. for 5 hours.

As shown in FIG. 5, 56 laminated semiconductor elements, each laminate consisting of two semiconductor elements of 9.7 mm×6.0 mm×0.4 mm (area 58 mm$^2$) with a pad pitch of 80 μm and coated on the back thereof with a die bond film DF-400 manufactured by Hitachi Kagaku Kogyo Co., Ltd., were arranged on a polyimide substrate of length 48 mm×width 171 mm×thickness 0.15 mm, and then contact-bonded at a contact-bonding pressure of 200° C. under a loading of 200 gf for a contact-bonding time of 10 seconds and further baked at 180° C. for 1 hour. Thereafter, the wire bonding region and the semiconductor element were wire-bonded with a metal wire of 30 μm in diameter and 5 mm in maximum length. Then, the encapsulating epoxy resin molding materials 1 to 9 were transfer-molded to a dimension of length 40 mm×width 83 mm×thickness 0.8 mm on the surface mounted with the semiconductor elements (BGA device of 0.95 mm in thickness) under the conditions described above as shown in FIG. 5, to prepare the BGA devices in Examples III-46 to III-54.

Using the molding materials III-10 to III-13 in place of the molding materials III-1 to III-9, the semiconductor devices in Comparative Examples III-21 to III-24 were prepared in the same manner as in Examples III-46 to III-54.

Further, a substrate mounted with only one semiconductor element of 5.1 mm×3.1 mm×0.4 mm area 16 mm$^2$) with a pad pitch of 100 μm, wherein the wire bonding region and the semiconductor element were wire-bonded with a wire of 30 μm in diameter and 1.5 mm in maximum length, was prepared in the same manner as in Examples III-46 to III-54, and the encapsulating epoxy resin molding materials III1 to III-13 were transfer-molded to a dimension of length 40 mm×width 83 mm×thickness 2.5 mm on the surface mounted with the semiconductor element (BGA device of 2.65 mm in thickness) under the conditions described above to prepare the BGA devices in Examples III-55 to III-63 or Comparative Examples III-25 to III-28.

The prepared semiconductor devices in Examples III-10 to III-63 and Comparative Examples III-5 to III-28 were evaluated for (1) wire sweep (indicator of wire sweep) and (2) the number of generated voids by the test method 2 described above. The evaluation results are shown in Tables 11 to 16.

TABLE 11

| | Molding Material III No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| Characteristics | 10 | 11 | 12 | 13 | 14 | 15 | 16 | 17 | 18 | 5 | 6 | 7 | 8 |
| Wire sweep (%) | 3 | 5 | 5 | 7 | 2 | 2 | 3 | 5 | 8 | 12 | 15 | 14 | 18 |
| Number of generated voids | 0/20 | 0/20 | 0/20 | 0/20 | 0/20 | 0/20 | 0/20 | 0/20 | 0/20 | 2/20 | 4/20 | 4/20 | 5/20 |

TABLE 12

| | Molding Material III No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| Characteristics | 19 | 20 | 21 | 22 | 23 | 24 | 25 | 26 | 27 | 9 | 10 | 11 | 12 |
| Wire sweep (%) | 0 | 0 | 0 | 0 | 0 | 0 | 0 | 0 | 0 | 3 | 5 | 4 | 7 |
| Number of generated voids | 0/20 | 0/20 | 0/20 | 0/20 | 0/20 | 0/20 | 0/20 | 0/20 | 0/20 | 0/20 | 2/20 | 0/20 | 2/20 |

TABLE 13

| | Molding Material III No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| Characteristics | 28 | 29 | 30 | 31 | 32 | 33 | 34 | 35 | 36 | 13 | 14 | 15 | 16 |
| Wire sweep (%) | 5 | 7 | 7 | 8 | 3 | 3 | 4 | 6 | 8 | 16 | 20 | 18 | 22 |
| Number of generated voids | 0/20 | 0/20 | 0/20 | 0/20 | 0/20 | 0/20 | 0/20 | 0/20 | 0/20 | 5/20 | 8/20 | 8/20 | 10/20 |

TABLE 14

| | Molding Material III No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| Characteristics | 37 | 38 | 39 | 40 | 41 | 42 | 43 | 44 | 45 | 17 | 18 | 19 | 20 |
| Wire sweep (%) | 2 | 3 | 3 | 3 | 0 | 1 | 2 | 3 | 3 | 7 | 8 | 7 | 9 |
| Number of generated voids | 0/20 | 0/20 | 0/20 | 0/20 | 0/20 | 0/20 | 0/20 | 0/20 | 0/20 | 0/20 | 3/20 | 1/20 | 2/20 |

TABLE 15

| | Molding Material III No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| Characteristics | 46 | 47 | 48 | 49 | 50 | 51 | 52 | 53 | 54 | 21 | 22 | 23 | 24 |
| Wire sweep (%) | 7 | 8 | 8 | 9 | 6 | 6 | 7 | 7 | 9 | 18 | 24 | 22 | 25 |
| Number of generated voids | 0/20 | 0/20 | 0/20 | 0/20 | 0/20 | 0/20 | 0/20 | 0/20 | 0/20 | 8/20 | 10/20 | 9/20 | 10/20 |

TABLE 16

| | Molding Material III No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| | | | | | Examples III | | | | | | Comparative Examples III | | |
| Characteristics | 55 | 56 | 57 | 58 | 59 | 60 | 61 | 62 | 63 | 25 | 26 | 27 | 28 |
| Wire sweep (%) | 3 | 3 | 3 | 3 | 2 | 2 | 2 | 3 | 3 | 9 | 10 | 9 | 11 |
| Number of generated voids | 0/20 | 0/20 | 0/20 | 0/20 | 0/20 | 0/20 | 0/20 | 0/20 | 0/20 | 0/20 | 2/20 | 2/20 | 2/20 |

As can be seen from the results in Tables 11 to 16, the semiconductor devices in Comparative Examples III-5 to III-28, encapsulated in the encapsulating epoxy resin molding materials III-10 to III-13 containing neither the silane coupling agent having a secondary amino group (C) nor the phosphate (D), generate the molding defect of either wire sweep (high wire deformation) or generation of voids.

On the other hand, it is evident form the results in Tables 15 to 20 that the encapsulating epoxy resin molding materials III-1 and III-9 containing the epoxy resin (A), the curing agent (B), the inorganic filler (E), the curing accelerator (F) and the phosphate (D), are excellent in fluidity, and the semiconductor devices in Examples III-10 to III-63, encapsulated therein, are excellent in moldability without generating voids with no wire sweep or with minimum wire deformation.

Those skilled in the art can understand that besides the embodiments described above, many modifications and alterations can be practiced without departure from the sprit and scope of this invention.

INDUSTRIAL APPLICABILITY

The encapsulating epoxy resin molding material for thin semiconductor devices according to this invention is excellent in fluidity, and the semiconductor device encapsulated therein, which is a semiconductor device having a semiconductor chip arranged on a thin, multi-pin, long wire, narrow-pad-pitch, or on a mounted substrate such as organic substrate or organic film, is free of molding defects such as wire sweep, voids etc. as shown in the Examples, and thus its industrial value is significant.

The invention claimed is:

1. An encapsulating epoxy resin molding material having a disk flow of 80 mm or more comprising (A) an epoxy resin having a melt viscosity at 150° C. of 2 poise or less and selected from the group consisting of a biphenyl epoxy resin represented by general formula (I), a bisphenol F epoxy resin represented by general formula (II), a stilbene epoxy resin represented by general formula (III), a sulfur atom-containing epoxy resin represented by general formula (VII), an o-cresol novolac epoxy resin and a dicyclopentadiene epoxy resin, (B) a phenol resin curing agent having a melt viscosity at 150° C. of 2 poise or less, (C) an aminosilane coupling agent consisting of a secondary amino group or (D) a phosphate, and (E) an inorganic filler consisting essentially of a spherical inorganic filler;

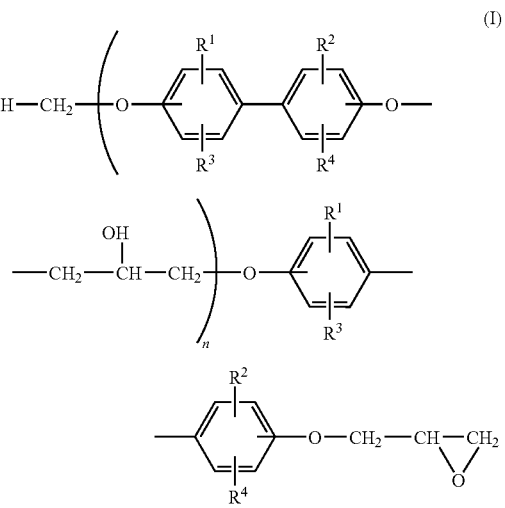

wherein $R^1$ to $R^4$ are the same or different and are selected from the group consisting of a hydrogen atom and a substituted or unsubstituted monovalent hydrocarbon group, and n is an integer of 0 to 3;

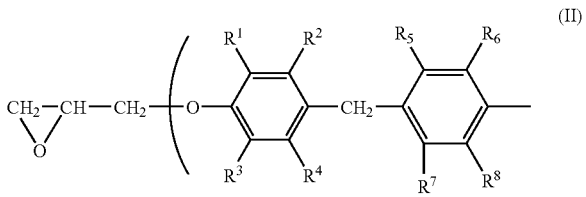

-continued

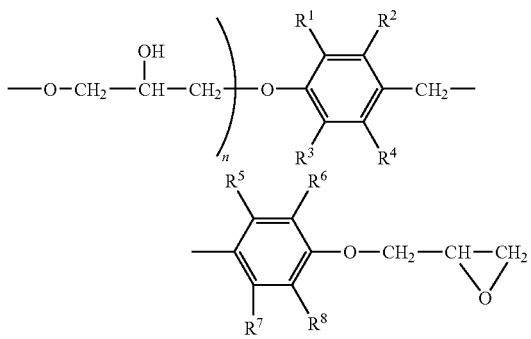

wherein $R^1$ to $R^8$ are the same or different and are selected from the group consisting of a hydrogen atom, a $C_{1-10}$ alkyl group, a $C_{1-10}$ alkoxy group, a $C_{6-10}$ aryl group, and a $C_{6-10}$ aralkyl group, and n is an integer of 0 to 3;

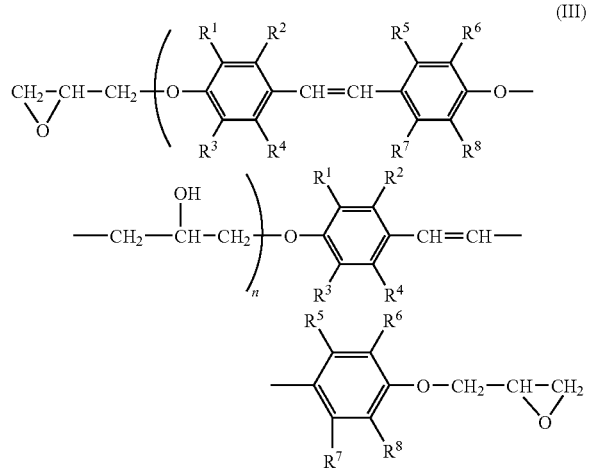
(III)

wherein $R^1$ to $R^8$ are the same or different and are selected from the group consisting of a hydrogen atom, a $C_{1-10}$ alkyl group, a $C_{1-10}$ alkoxy group, a $C_{6-10}$ aryl group and a $C_{6-10}$ aralkyl group, and n is an integer of 0 to 3;

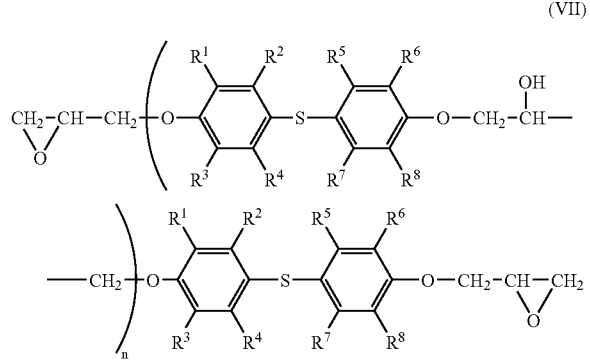
(VII)

wherein $R^1$ to $R^8$ are the same or different and are selected from the group consisting of a hydrogen atom, a $C_{1-10}$ alkyl group, a $C_{1-10}$ alkoxy group, a $C_{6-10}$ aryl group, and a $C_{6-10}$ aralkyl group, and n is an integer of 0 to 3.

2. The encapsulating epoxy resin molding material described in claim 1, wherein the encapsulating epoxy resin molding material is used for the semiconductor device having at least one of the following constitutions (a) to (f):

(a) at least one of an encapsulating material of an upper side of a semiconductor chip and an encapsulating material of a lower side of the semiconductor chip has a thickness 0.7 mm or less;

(b) the pin count is 80 or more;

(c) the length of the wire is 2 mm or more;

(d) the pad pitch on the semiconductor chip is 90 μm or less;

(e) the thickness of a package, in which the semiconductor chip is disposed on a mounting substrate, is 2 mm or less; and (f) the area of the semiconductor chip is 25 mm² or more.

3. The encapsulating epoxy resin molding material described in claim 2, wherein the encapsulating epoxy resin molding material is used for the semiconductor device having at least one of the constitutions (a) to (f) in the following combination (1) or (2):

(1) the constitution (a) or (e); and (2) the constitutions (a) and at least one of other constitutions (b) to (f).

4. The encapsulating epoxy resin molding material described in claim 2, which is used in a semiconductor device having the constitutions (a) to (f) in any one of the following combinations (1) to (3):

(1) the constitutions (b) and (c);

(2) the constitutions (b) and (d); and (3) the constitutions (b), (c) and (d).

5. The encapsulating epoxy resin molding material described in claim 2, which is used in a semiconductor device having the constitutions (a) to (f) in any one of the following combinations (1) to (9):

(1) the constitutions (a) and (b);

(2) the constitutions (a) and (c);

(3) the constitutions (a) and (d);

(4) the constitutions (a) and (f);

(5) the constitutions (c) and (e);

(6) the constitutions (a), (b) and (d);

(7) the constitutions (c), (e) and (f);

(8) the constitutions (a), (b), (d) and (f); and (9) the constitutions (a), (b), (c) and (d).

6. The encapsulating epoxy resin molding material described in claim 1, which further comprises (F) a curing accelerator.

7. The encapsulating epoxy resin molding material described in claim 2, wherein the semiconductor device is a stacked package.

8. The encapsulating epoxy resin molding material described in claim 2, wherein the semiconductor device is a mold array package.

9. The encapsulating epoxy resin molding material described in claim 1, wherein the phenol resin curing agent (B) comprises:

a phenol-aralkyl resin represented by the general formula (IV):

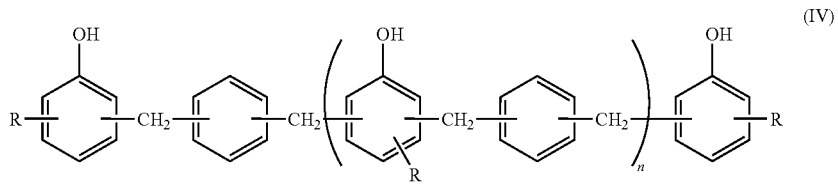

wherein R is selected from the group consisting of a hydrogen atom and a $C_{1-10}$ substituted or unsubstituted monovalent hydrocarbon group, and n is an integer of 0 to 10, and/or a biphenyl phenol resin represented by the general formula (V):

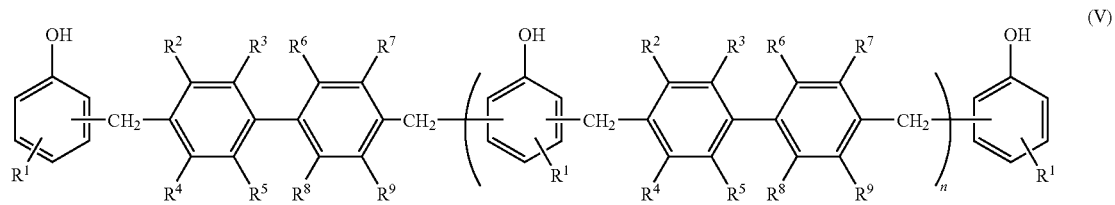

wherein $R^1$ to $R^9$ are the same or different and are selected from the group consisting of a hydrogen atom, a $C_{1-10}$ alkyl group, a $C_{1-10}$ alkoxy group, a $C_{6-10}$ aryl group and a $C_{6-10}$ aralkyl group, and n is an integer of 0 to 10.

10. The encapsulating epoxy resin molding material described in claim 1, wherein the encapsulating epoxy resin molding material comprises the aminosilane coupling agent consisting of a secondary amino group (C), and the aminosilane coupling agent consisting of a secondary amino group comprises a compound represented by the general formula (VI):

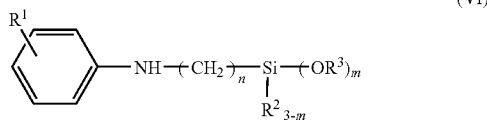

wherein $R^1$ is selected from the group consisting of a hydrogen atom, a $C_{1-6}$ alkyl group and a $C_{1-2}$ alkoxy group, $R^2$ is selected from the group consisting of a $C_{1-6}$ alkyl group and a phenyl group, $R^3$ represents a methyl or ethyl group, n is an integer of 1 to 6, and m is an integer of 1 to 3.

11. The encapsulating epoxy resin molding material described in claim 1, wherein the encapsulating epoxy resin molding material comprises the phosphate (D), and the phosphate (D) comprises a compound represented by the general formula (X):

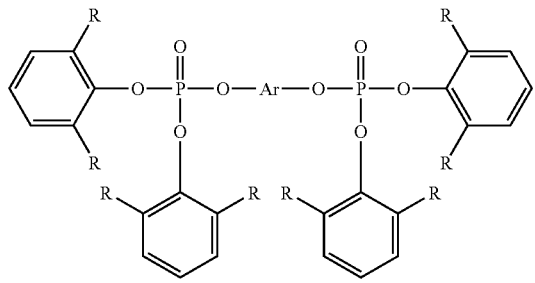

wherein eight R groups are the same or different and represent a $C_{1-4}$ alkyl group, and Ar represents an aromatic group.

12. The encapsulating epoxy resin molding material described in claim 10, wherein the aminosilane coupling agent consisting of a secondary amino group (C) is γ-anilinopropyltrimethoxysilane.

13. The encapsulating epoxy resin molding material described in claim 1, wherein the epoxy resin (A) has a melt viscosity at 150° C. of 1 poise or less.

14. The encapsulating epoxy resin molding material described in claim 1, wherein the epoxy resin (A) has a melt viscosity at 150° C. of 0.5 poise or less.

15. The encapsulating epoxy resin molding material described in claim 1, wherein the phenol resin curing agent (B) has a melt viscosity at 150° C. of 1 poise or less.

16. The encapsulating epoxy resin molding material described in claim 1, wherein the encapsulating epoxy resin molding material comprises the aminosilane coupling agent consisting of a secondary amino group (C), and the aminosilane coupling agent consisting of a secondary amino group is selected from the group consisting of γ-anilinopropyltrimethoxy silane, γ-anilinopropyltriethoxy silane, γ-anilinopropylmethyldimethoxy silane, γ-anilinopropylmethyldiethoxy silane, γ-anilinopropylethyldiethoxy silane, γ-anilinopropylethyldimethoxy silane, γ-anilinomethyltrimethoxy silane, γ-anilinomethyltriethoxy silane, γ-anilinomethylmethyldimethoxy silane, γ-anilinomethylmethyldiethoxy silane, γ-anilinomethylethyldiethoxy silane, γ-anilinomethylethyldimethoxy silane, N-(p-methoxyphenyl)-γ-aminopropyltrimethoxy silane, N-(p-methoxyphenyl)-γ-aminopropyltriethoxy silane, N-(p-methoxyphenyl)-γ-aminopropylmethyldimethoxy silane, N-(p-methoxyphenyl)-γ-aminopropylmethyldiethoxy silane, N-(p-methoxyphenyl)-γ-aminopropylethyldiethoxy silane, and N-(p-methoxyphenyl)-γ-aminopropylethyldimethoxy silane.

17. The encapsulating epoxy resin molding material described in claim 1, wherein the encapsulating epoxy resin molding material comprises the aminosilane coupling agent consisting of a secondary amino group (C) in an amount 50% by weight or more, relative to the total amount of the coupling agent.

18. The encapsulating epoxy resin molding material described in claim 1, wherein the epoxy resin (A) comprises a biphenyl epoxy resin represented by general formula (I).

19. The encapsulating epoxy resin molding material described in claim 1, wherein the epoxy resin (A) comprises a bisphenol F epoxy resin represented by general formula (II).

20. The encapsulating epoxy resin molding material described in claim 1, wherein the epoxy resin (A) comprises a stilbene epoxy resin represented by general formula (III).

21. The encapsulating epoxy resin molding material described in claim 1, wherein the epoxy resin (A) comprises a sulfur atom-containing epoxy resin represented by general formula (VII).

22. The encapsulating epoxy resin molding material described in claim 1, wherein the epoxy resin (A) comprises an o-cresol novolac epoxy resin.

23. The encapsulating epoxy resin molding material described in claim 1, wherein the epoxy resin (A) comprises a dicyclopentadiene epoxy resin.

24. The encapsulating epoxy resin molding material described in claim 11 wherein the phosphate (D) is at least one phosphate selected form the group consisting of formulae (XI)-(XV):

(XI)

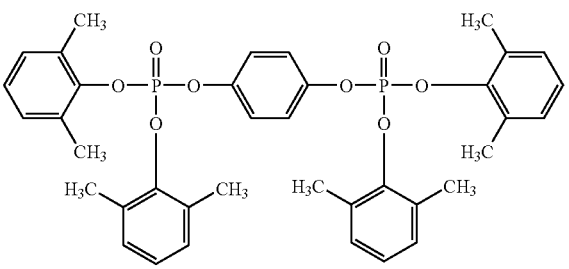

(XII)

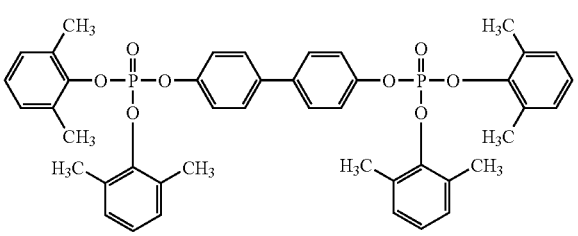

(XIII)

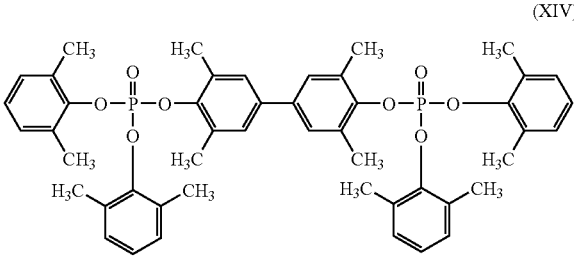

(XIV)

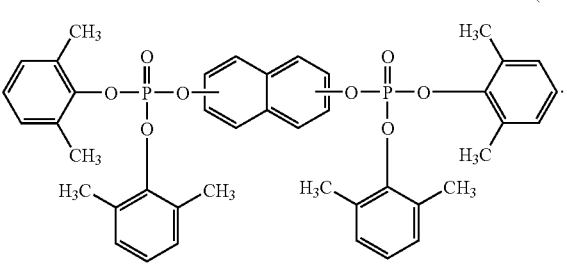

(XV)

25. The encapsulating epoxy resin molding material described in claim 1, wherein the encapsulating epoxy resin molding material comprises the phosphate (D), and the phosphate (D) is an triphenyl phosphate.

26. The encapsulating epoxy resin molding material described in claim 1, wherein said spherical inorganic filler is a silica.

* * * * *